United States Patent
Kawahara et al.

(10) Patent No.: US 9,236,488 B2
(45) Date of Patent: Jan. 12, 2016

(54) THIN FILM TRANSISTOR AND METHOD FOR PRODUCING SAME

(75) Inventors: Toshio Kawahara, Aichi (JP);
Kazumasa Okamoto, Hokkaido (JP);
Kazuhiko Matsumoto, Osaka (JP); Risa Utsunomiya, Kyoto (JP); Teruaki Matsuba, Kyoto (JP); Hitoshi Matsumoto, Kyoto (JP)

(73) Assignees: CHUBU UNIVERSITY EDUCATIONAL FOUNDATION, Aichi (JP); NATIONAL UNIVERSITY CORPORATION HOKKAIDO UNIVERSITY, Hokkaido (JP); OSAKA UNIVERSITY, Osaka (JP); NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 14/422,002

(22) PCT Filed: Aug. 23, 2012

(86) PCT No.: PCT/JP2012/071297
§ 371 (c)(1),
(2), (4) Date: Feb. 17, 2015

(87) PCT Pub. No.: WO2014/030239
PCT Pub. Date: Feb. 27, 2014

(65) Prior Publication Data
US 2015/0221779 A1 Aug. 6, 2015

(51) Int. Cl.
*H01L 29/78* (2006.01)
*H01L 29/786* (2006.01)
*H01L 29/66* (2006.01)
(Continued)

(52) U.S. Cl.
CPC ...... *H01L 29/78687* (2013.01); *H01L 29/1033* (2013.01); *H01L 29/1606* (2013.01); *H01L 29/66045* (2013.01); *H01L 29/66742* (2013.01); *H01L 29/778* (2013.01);
(Continued)

(58) Field of Classification Search
None
See application file for complete search history.

(56) References Cited

U.S. PATENT DOCUMENTS

| | | | |
|---|---|---|---|
| 2010/0102292 A1* | 4/2010 | Hiura et al. | 257/9 |
| 2010/0200839 A1* | 8/2010 | Okai et al. | 257/29 |
| 2013/0302963 A1* | 11/2013 | Afzali-Ardakani et al. | 438/299 |

FOREIGN PATENT DOCUMENTS

| | | |
|---|---|---|
| JP | 2006-272491 | 10/2006 |
| JP | 2011-190156 | 9/2011 |
| WO | 2010-038793 | 4/2010 |

OTHER PUBLICATIONS

"International Search Report (Form PCT/ISA/210)", mailed on Oct. 2, 2012, with English translation thereof, pp. 1-2, in which three of the listed references (JP2011-190156 and WO2010-038793) were cited.

*Primary Examiner* — Scott B Geyer
(74) *Attorney, Agent, or Firm* — Jianq Chyun IP Office

(57) ABSTRACT

A thin film transistor is equipped with a silicon substrate, a channel layer, a source electrode and a drain electrode. The channel layer, the source electrode and the drain electrode are arranged on the main surface of the silicon substrate. The channel layer is composed of multiple carbon nanowall thin films, wherein the multiple carbon nanowall thin films are arranged in parallel to each other between the source electrode and the drain electrode, one end of each of the multiple carbon nanowall thin films is in contact with the source electrode, and the other end of each of the multiple carbon nanowall thin films is in contact with the drain electrode. An insulating film and a gate electrode are arranged on the rear surface side of the silicon substrate.

9 Claims, 42 Drawing Sheets

(51) Int. Cl.
*H01L 29/778* (2006.01)
*H01L 29/16* (2006.01)
*H01L 29/10* (2006.01)

(52) U.S. Cl.
CPC ........ *H01L 29/7788* (2013.01); *H01L 29/7789* (2013.01); *H01L 29/78603* (2013.01); *H01L 29/78684* (2013.01)

(f)

(g)

(h)

(i)

(j)

(k)

THIN FILM TRANSISTOR AND METHOD FOR PRODUCING SAME

CROSS-REFERENCE TO RELATED APPLICATION

This application is a 371 application of an International PCT application serial no. PCT/JP2012/071297, filed on Aug. 23, 2012. The entirety of the abovementioned patent application is hereby incorporated by reference herein and made a part of this specification.

BACKGROUND OF THE INVENTION

1. Field of the Invention

The present invention relates to a thin film transistor and a method for producing the same.

2. Description of the Related Art

Vertical current driven devices using carbon nanowalls have been known (Patent Literature 1).

FIG. 50 is a schematic view of a conventional vertical current driven device. Referring to FIG. 50, a conventional vertical current driven device 500 includes a carbon nanowall 501, a source electrode 502, a drain electrode 503 and a gate electrode 504.

The carbon nanowall 501 is formed of a structure in which a plurality of graphene sheets are laminated.

The source electrode 502 is disposed at one end of the carbon nanowall 501, and the drain electrode 503 is disposed so as to contact the outermost surface or the lowermost surface of the carbon nanowall 501 at the top portion of the carbon nanowall 501. The gate electrode 504 is disposed so as to contact the outermost surface of the carbon nanowall 501.

PRIOR-ART DOCUMENTS

Patent Documents

Patent Literature 1: Japanese Patent Application Publication No. 2006-272491

SUMMARY OF THE INVENTION

Problems to be Solved by the Invention

However, since Patent Literature 1 does not mention any methods for controlling the orientation of the carbon nanowall, there exist the problems that it is difficult to form the channel layer of the vertical current driven device with a plurality of carbon nanowalls, and that it is difficult to pass larger electric current through the vertical current driven device compared to the case that the channel layer is composed of a single carbon nanowall.

The present invention has been made to solve the above-mentioned problems, and its purpose is to provide a thin film transistor through which larger electric current can pass compared to the case that the channel layer is formed of a single carbon nanowall.

Another purpose of the present invention is to provide a method for producing a thin film transistor through which larger electric current can pass compared to the case that the channel layer is formed of a single carbon nanowall.

Means for Solving the Problems

In an embodiment of the present invention, the thin film transistor includes a silicon substrate, a channel layer, a source electrode, a drain electrode, a gate electrode and an insulating film. The silicon substrate has a main surface formed with a stripe-like or grid-like concave-convex configuration. The channel layer is formed of a plurality of carbon nanowall thin films which are disposed on a plurality of protruding portions along a length direction of the protruding portion of the concave-convex shape, and respectively grows along the normal direction of the silicon substrate. The source electrode at least contacts a first side surface of each of the carbon nanowall thin films which is in parallel to the thickness direction of the carbon nanowall thin film. The drain electrode is disposed so as to be opposed to the source electrode along the in-plane direction of the carbon nanowall thin films, and at least contacts a second side surface opposite to the first side surface of the carbon nanowall thin films. The insulating film is disposed between the carbon nanowall thin films and the gate electrode.

According to an embodiment of the present invention, the method for producing the thin film transistor is a method for producing the thin film transistor using a plurality of carbon nanowall thin films as the channel layer, and includes: the first process to form a concave-convex shape in stripe-like or grid-like configurations on one main surface of a silicon substrate; the second process to form a plurality of carbon nanowall thin films on protruding portions of the concave-convex shape along the length direction of the protruding portion; the third process to form a source electrode so as to at least contact the first side surface of each of the carbon nanowall thin films which is in parallel to the thickness direction of the carbon nanowall thin film; the fourth process to form a drain electrode disposed so as to be opposed to the source electrode along the in-plane direction of the carbon nanowall thin films and to at least contact the second side surface of each of the carbon nanowall thin films which is opposite to the first side surface; the fifth process to form an insulating film so as to face the carbon nanowall thin films; and the sixth process to form a gate electrode so as to contact the insulating film.

Effects of Invention

In the thin film transistor in an embodiment of the present invention, a plurality of carbon nanowall thin films forming the channel layer are disposed in parallel between the source electrode and the drain electrode. As a result, when desired electric current is applied to the gate electrode, the electric current flows in parallel in the plurality of carbon nanowall thin films between the source electrode and the drain electrode.

Accordingly, it is possible to pass larger electric current through compared to the case that the channel layer is formed of a single carbon nanowall thin film.

In the method for producing the thin film transistor in an embodiment of the present invention, the thin film transistor is produced so as to dispose a plurality of carbon nanowall thin films forming the channel layer in parallel between the source electrode and the drain electrode.

Accordingly, in the thin film transistor produced by the method described in embodiments of the present invention, larger electric current can pass through compared to the case that the channel layer is formed of a single carbon nanowall thin film.

DESCRIPTION OF THE EMBODIMENTS

Figure 1:
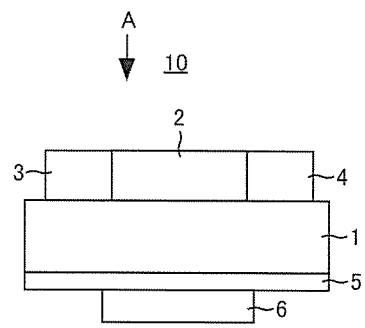
FIG. 1 is a cross-sectional view illustrating the structure of a thin film transistor of the first embodiment of the present invention.

Exemplary embodiments of the present invention are described in detail below with reference to the drawings. In the drawings, identical or equivalent parts are assigned with the same reference numerals and descriptions thereof will not be repeated.

First Embodiment

Figure 2:
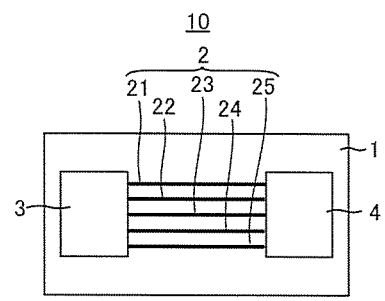
FIG. 2 is a plan view of a thin film transistor when viewed from the A direction shown in FIG. 1.

FIG. 1 is a cross-sectional view illustrating the structure of a thin film transistor of the first embodiment of the present invention. FIG. 2 is a plan view of the thin film transistor when viewed from the A direction shown in FIG. 1.

Referring to FIGS. 1 and 2, a thin film transistor 10 of the first embodiment of the present invention includes a silicon substrate 1, a channel layer 2, a source electrode 3, a drain electrode 4, an insulating film 5 and a gate electrode 6.

The silicon substrate 1 is composed of any one of n-type monocrystalline silicon, p-type monocrystalline silicon, n-type polycrystalline silicon, and p-type polycrystalline silicon. The silicon substrate 1 has resistivity of, for example, 0.1 to 1 Ω·cm.

The channel layer 2 is disposed on one main surface of the silicon substrate 1. The channel layer 2 is composed of a plurality of carbon nanowall thin films 21 to 25. The carbon nanowall thin films 21 to 25 are disposed substantially vertical to the silicon substrate 1 and substantially in parallel to each other.

The source electrode 3 is disposed so as to contact one end of the channel layer 2 in the in-plane direction of the silicon substrate 1. The drain electrode 4 is disposed to be in contact with the other end of the channel layer 2 and to be opposed to the source electrode 3 in the in-plane direction of the silicon substrate 1.

Each of the source electrode 3 and the drain electrode 4 is disposed to be in contact with each of the carbon nanowall thin films 21 to 25.

The insulating film 5 is composed of, for example, silicon dioxide ($SiO_2$). The insulating film 5 is disposed on a surface of the silicon substrate 1 opposite to the one main surface where the channel layer 2 is disposed.

The gate electrode 6 is disposed to be in contact with the insulating film 5.

Each of the source electrode 3, the drain electrode 4, and the gate electrode 6 is composed of a laminated structure of Ti/Au, for example. The thickness of Ti is, for example, 10 nm, and the thickness of Au is, for example, 20 nm.

Figure 3:
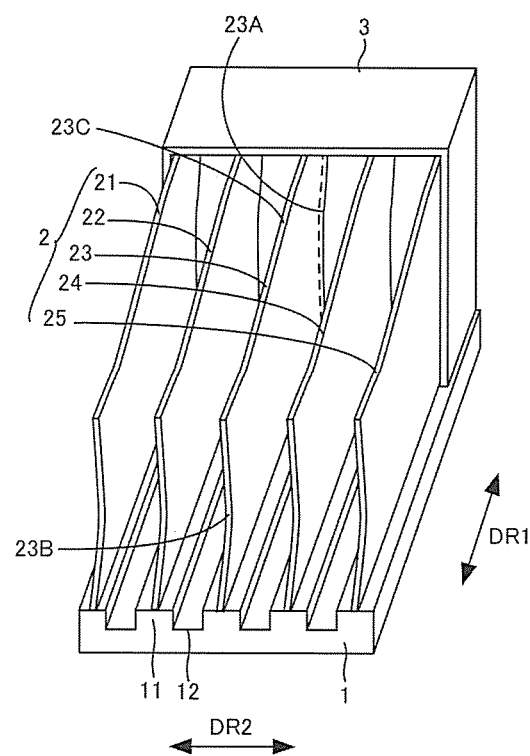
FIG. 3 is a perspective view of the silicon substrate, the channel layer, and the source electrode shown in FIGS. 1 and 2.

FIG. 3 is a perspective view of the silicon substrate 1, the channel layer 2, and the source electrode 3 shown in FIGS. 1 and 2.

Referring to FIG. 3, the silicon substrate 1 is formed of silicon or glass, for example. The silicon substrate 1 includes protruding portions 11 and recessed portions 12. The protruding portions 11 and the recessed portions 12 are formed in a direction DR1 on a main surface of the silicon substrate 1. A length of each of the protruding portions 11 and a length of each of the recessed portions 12 may be respectively equal to or smaller than a length of the substrate silicon 1 in the direction DR1. The protruding portions 11 and the recessed portions 12 are alternately formed in a direction DR2, which is perpendicular to the direction DR1. Each of the protruding portions 11 has a length of 0.1-0.5 μm in the direction DR2. Each of the recessed portions 12 has a length of 0.6-1.5 μm in the direction DR2. That is, each of the protruding portions 11 has a width of 0.1-0.5 μm, and each of the recessed portions 12 has a width of 0.6-1.5 μm. In addition, a height of each of the protruding portions 11 (which is equal to a depth of each of the recessed portions 12) is 0.3-0.6 μm.

In this way, one main surface of the substrate 1 has a stripe-like concave-convex configuration formed thereon.

Each of the carbon nanowall thin films 21-25 of the channel layer 2 is formed on the protruding portions 11 in a length direction (i.e. the direction DR1) of the protruding portions 11 of the silicon substrate 1.

In addition, each of the carbon nanowall thin films 21-25 has a thickness of 10-15 nm and a height of 60-2500 nm.

In this way, the plurality of carbon nanowall thin films 21-25 is arranged in the length direction of the protruding portions 11 of the silicon substrate 1. In other words, the plurality of carbon nanowall thin films 21-25 is aligned in a desired pattern.

The source electrode 3 is disposed so as to cover one end of each of the plurality of carbon nanowall thin films 21 to 25 on the silicon substrate 1. In this case, the source electrode 3 contacts a side surface 23A, which is in parallel to the thickness direction of the carbon nanowall thin film 23, and an upper surface 23C at one end side of the carbon nanowall thin film 23. Likewise, the source electrode 3 contacts side surfaces (=side surfaces corresponding to the side surface 23A), which are in parallel to the thickness direction of carbon nanowall thin films 21, 22, 24 and 25, and upper surfaces (=upper surfaces corresponding to the upper surface 23C) at one end side of the carbon nanowall thin films 21, 22, 24 and 25.

Accordingly, the source electrode 3 at least contacts the side surfaces 23A which are in parallel to the thickness direction of the plurality of carbon nanowall thin films 21 to 25 respectively.

The drain electrode 4 contacts a side surface 23B which is opposite to the side surface 23A of the carbon nanowall thin film 23 and an upper surface 23C at the other end side of the carbon nanowall thin film 23. Likewise, the drain electrode 4 contacts side surfaces (=side surfaces corresponding to the side surface 23B) which are opposite to the side surfaces of the carbon nanowall thin films 21, 22, 24 and 25 (=side surfaces corresponding to the side surface 23A), and upper surfaces (=upper surfaces corresponding to the upper surface 23C) at the other end side of the carbon nanowall thin films 21, 22, 24 and 25.

Accordingly, the drain electrode 4 at least contacts the side surface 23B opposite to the side surface 23A which is in parallel to the thickness direction of the plurality of carbon nanowall thin films 21 to 25 on each of the carbon nanowall thin films 21 to 25.

Therefore, the source electrode 3 and the drain electrode 4 sandwich the carbon nanowall thin films 21 to 25 from the direction DR1 along which the protruding portions 11 and the recessed portions 12 are formed. As a result, the source electrode 3 and the drain electrode 4 at least contact the opposing side surfaces 23A and 23B of the carbon nanowall thin films 21 to 25.

When desired voltage is applied to the gate electrode 6, electrons or holes are induced at the side of the silicon substrate 1 of the plurality of carbon nanowall thin films 21 to 25 of the channel layer 2, and when desired voltage is applied between the source electrode 3 and the drain electrode 4 while electrons or holes are induced, electric current flows between the source electrode 3 and the drain electrode 4 through the area where the electrons or the holes of the carbon nanowall thin films 21 to 25 are induced by the electric field distribution affected by low dimensionality of the carbon nanowall thin films 21 to 25. Then, the current value flowing between the source electrode 3 and the drain electrode 4 is controlled by the voltage applied to the gate electrode 6. In this case, the electric current flows in parallel through the plurality of carbon nanowall thin films 21 to 25 between the source electrode 3 and the drain electrode 4.

Accordingly, larger electric current can pass through the thin film transistor 10 compared to the case that the channel layer is composed of a single carbon nanowall thin film.

As described above, the thin film transistor 10 is a thin film transistor using the plurality of carbon nanowall thin films 21 to 25 as the channel layer 2. The thin film transistor 10 is a back-gate type thin film transistor in which the gate electrode 6 is disposed below the channel layer 2.

Figure 4:
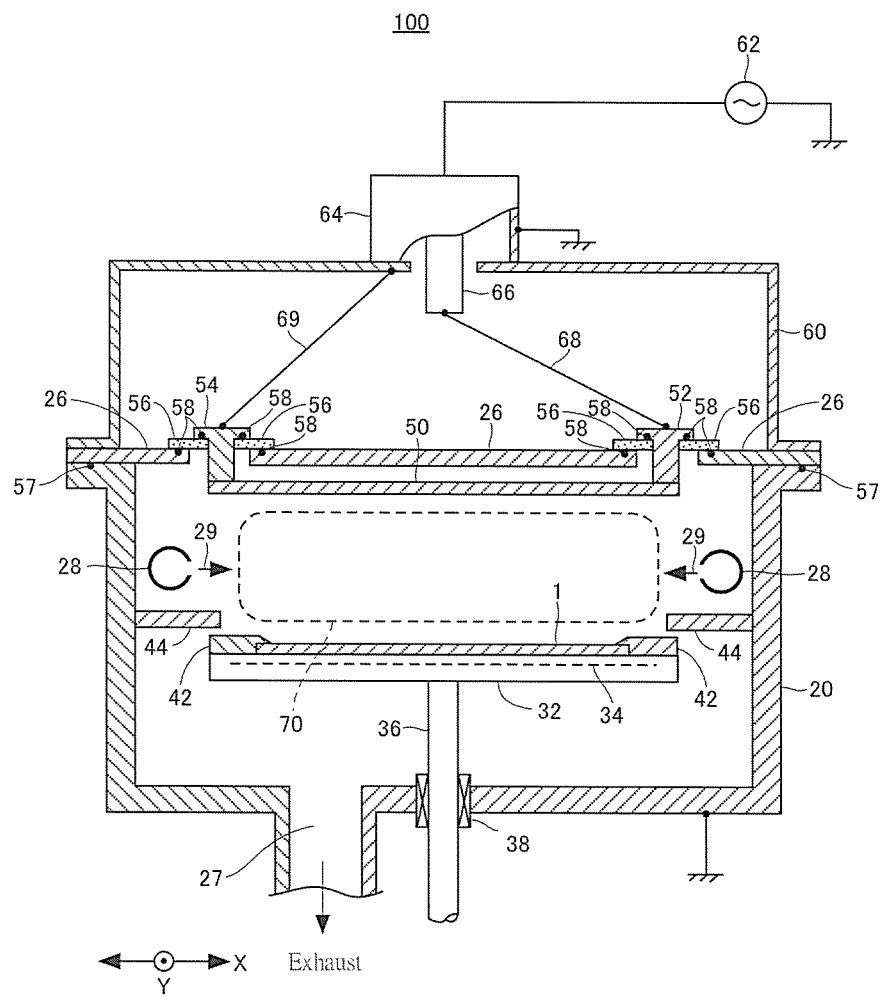
FIG. 4 is a cross-sectional view illustrating the structure of a plasma apparatus which fabricates the plurality of carbon nanowall thin films shown in FIG. 1.

FIG. 4 is a schematic cross-sectional view showing a structure of a plasma apparatus for manufacturing the plurality of carbon nanowall thin films 21-25 of FIG. 1. With reference to FIG. 4, a plasma apparatus 100 includes a vacuum container 20, a top plate 26, an exhaust port 27, a gas inlet 28, a holder 32, a heater 34, a shaft 36, a bearing portion 38, a mask 42, a partition plate 44, a plane conductor 50, a power feeding electrode 52, a termination electrode 54, an insulating flange 56, packings 57 and 58, a shield box 60, a high-frequency power source 62, a matching circuit 64, and connection conductors 68 and 69.

The vacuum container 20 is made of a metal and is connected with a vacuum exhaust device via the exhaust port 27. Furthermore, the vacuum container 20 is electrically connected with a ground node. The top plate 26 is disposed to be in contact with the vacuum container 20 so as to close an upper side of the vacuum container 20. In this case, the packing 57 for vacuum sealing is disposed between the vacuum container 20 and the top plate 26.

The gas inlet 26 is disposed above the partition plate 44 in the vacuum container 20. The shaft 36 is fixed to a bottom surface of the vacuum container 20 via the bearing portion 38. The holder 32 is secured to an end of the shaft 36. The heater 34 is disposed in the holder 32. The mask 42 is disposed on the holder 32 and located at a peripheral edge portion of the holder 32. The partition plate 44 is fixed to a side wall of the vacuum container 20 and located above the holder 32 for closure between the vacuum container 20 and the holder 32.

The power feeding electrode 52 and the termination electrode 54 are fixed to the top plate 26 via the insulating flange 56. In this case, the packing 58 for vacuum sealing is disposed between the top plate 26 and the insulating flange 56.

The plane conductor 50 is disposed so that two end portions thereof in an X direction are respectively in contact with the power feeding electrode 52 and the termination electrode 54. A length of the power feeding electrode 52 and a length of the termination electrode 54 are substantially equal to a length of the plane conductor 50 respectively in a Y direction (i.e. a direction perpendicular to the paper plane of FIG. 4), as described later. In addition, the power feeding electrode 52 is connected with an output bar 66 of the matching circuit 64 by the connection conductor 68. The termination electrode 54 is connected with the shield box 60 via the connection conductor 69. The plane conductor 50, the power feeding electrode 52, and the termination electrode 54 are formed of copper and aluminum, etc., for example.

The shield box 60 is disposed on the upper side of the vacuum container 20 and is in contact with the top plate 26. The high-frequency power source 62 is connected between the matching circuit 64 and the ground node. The matching circuit 64 is disposed on the shield box 60.

The connection conductors 68 and 69 are plate-shaped and each have a length substantially equal to the lengths of the power feeding electrode 52 and the termination electrode 54 in the Y direction.

The gas inlet 28 supplies a gas 29, such as methane (CH4) gas and hydrogen (H2) gas, etc., supplied from a gas cylinder (not shown), into the vacuum container 20. The holder 32 supports the silicon substrate 1. The heater 34 heats the silicon substrate 1 to a desired temperature. The shaft 36 supports the holder 32. The mask 42 covers a peripheral edge portion of the silicon substrate 1, so as to prevent a product from being formed at the peripheral edge portion of the silicon substrate 1. The partition plate 44 prevents plasma 70 from reaching a holding mechanism of the silicon substrate 1.

The power feeding electrode 52 supplies a high-frequency current that is supplied from the connection conductor 68 to the plane conductor 50. The termination electrode 54 connects an end portion of the plane conductor 50 to the ground node directly or via a capacitor so as to form a close loop of the high-frequency current between the high-frequency power source 62 and the plane conductor 50.

The high-frequency power source 62 supplies a high-frequency electric power of 13.56 MHz, for example, to the matching circuit 64. The matching circuit 64 suppresses reflection of the high-frequency electric power supplied from the high-frequency power source 62 and supplies the same to the connection conductor 68.

Figure 5:
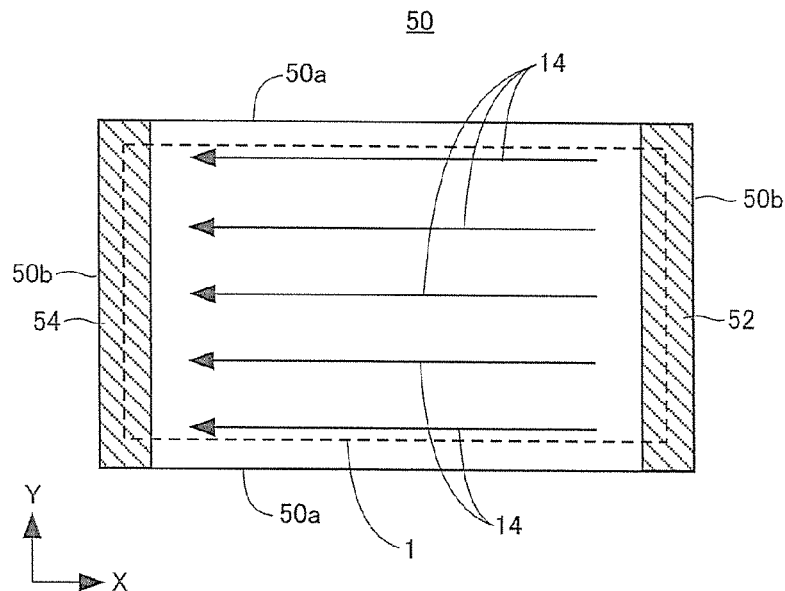
FIG. 5 is a plan view of a plane conductor, a power feeding electrode, and a termination electrode when viewed from the matching circuit side shown in FIG. 4.

FIG. 5 is a plan view of the plane conductor 50, the power feeding electrode 52, and the termination electrode 54 when viewed from the side of the matching circuit 64 of FIG. 4. With reference to FIG. 5, the plane conductor 50 has a rectangular plane shape, for example, and has sides 50a and 50b. The side 50a is longer than the side 50b. Moreover, the side 50a is arranged in the X direction while the side 50b is arranged in the Y direction.

The power feeding electrode 52 and the termination electrode 54 are respectively disposed at the two end portions of the plane conductor 50 in the X direction and arranged along the sides 50b of the plane conductor 50. In order to make the high-frequency current 16 flow as uniform as possible in the Y direction, preferably the lengths of the power feeding electrode 52 and the termination electrode 54 in the Y direction approximate to the lengths of the sides 50b, parallel to the Y direction, of the plane conductor 50 (for instance, the lengths of the sides 50b are substantially equal). However, the lengths of the power feeding electrode 52 and the termination electrode 54 in the Y direction may be somewhat longer or shorter than the lengths of the sides 50b. When represented in figures, the lengths of the power feeding electrode 52 and the termination electrode 54 in the Y direction may be set to be 85% of the lengths of the sides 50b or more.

The power feeding electrode 52 and the termination electrode 54 are block-shaped electrodes. Thus, the high-frequency current 16 can flow in the plane conductor 50 substantially uniformly in the Y direction.

When using point-shaped electrodes to supply the high-frequency current to the plane conductor 50, the high-frequency current does not flow uniformly through the plane conductor 50. Generally, even when high-frequency electric power is supplied to the plane conductor, in a state where plasma is not present in the vicinity of the plane conductor, the high-frequency current flows with concentration at four corners of a cross-section that is orthogonal to a conducting direction of the plane conductor due to a skin effect, etc. The reason is that a distribution of high-frequency impedance becomes smaller at the four corners of the plane conductor and becomes larger at other portions.

Figure 6A:
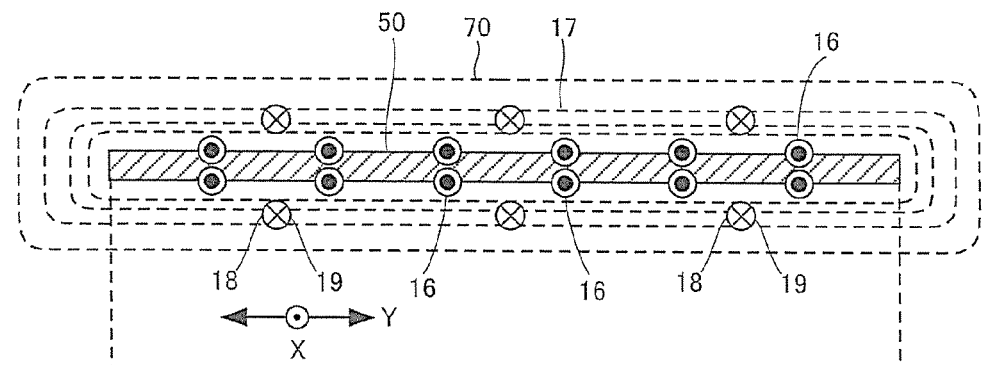
FIGS. 6A and 6B are diagrams illustrating the cross-sectional view and the plasma density of the plane electrode along the Y direction.
Figure 6B:
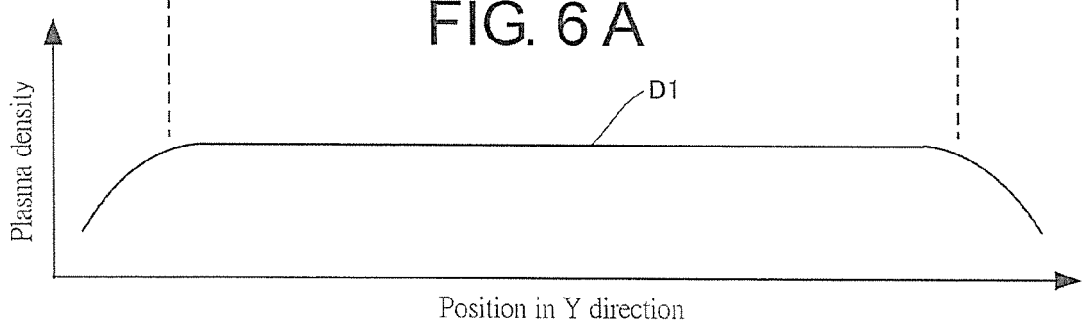

FIG. 6 includes a schematic cross-sectional view of the plane conductor 50 in the Y direction and a diagram showing a plasma density. In the plasma apparatus 100, the plasma 70 is generated in the vicinity of the plane conductor 50. That is, as shown in FIG. 4, when the high-frequency current 16 flows in the plane conductor 50, a high-frequency magnetic field 17 is generated around the plane conductor 50, and thereby an induced electric field 18 is generated in an opposite direction of the high-frequency current 16. Then, electrons are accelerated by the induced electric field 18 and the gas 28 in the vicinity of the plane conductor 50 (see FIG. 4) is ionized. The plasma 70 is generated in the vicinity of the plane conductor 50, and an induced current 19 flows in the plasma 70 in the same direction (i.e. the opposite direction of the high-frequency current 16) as the induced electric field 18.

Accordingly, when the plasma 70 is generated in the vicinity of the plane conductor 50 and the induced current 19 flows in the plasma 70 in the opposite direction of the high-frequency current 16, the high-frequency current 16 that flows through the plane conductor 50 becomes uniform in the Y direction that is orthogonal to the conducting direction. The reason is explained below.

In the technical field of electric power distribution, it is known that, if a current flowing in a plane conductor such as a bus bar, is in an opposite direction to a current flowing in another conductor nearby, impedance distributions of the conductors change each other, and low impedances and uniformization of impedances occur. It is considered to be related with the decrease of the number of interlinkages of magnetic flux resulting from the flow of currents in opposite directions. The plasma apparatus 100 applies such a phenomenon to the relationship between the plane conductor and the plasma.

Thus, as shown in FIG. 6, when plasma, especially the high-density plasma 70, is generated in the vicinity of the plane conductor 50, the distribution of the high-frequency current 16 that flows in the plane conductor 50 is uniformized in the Y direction. By combining the aforementioned with disposition of the block-shaped power feeding electrode 52 and termination electrode 54, the high-frequency current 16 flows in the plane conductor 50 with a substantially uniform distribution in the Y direction. Therefore, the induced electric field 18 and the induced current 19, which are distributed substantially uniformly not only in the X direction (i.e. the conducting direction) but also in the Y direction orthogonal to the X direction, are generated near a face of the plane conductor 50, at which the plasma 70 is generated. Due to the induced electric field 18, the plasma can be generated with good uniformity over a wide range along the face of the plane conductor 50. A plasma density distribution D1 is substantially uniform as shown in FIG. 6.

Accordingly, the plasma apparatus 100 generates inductively coupled plasma by uniform flow of the high-frequency current 16 in the plane conductor 50.

Figure 7:
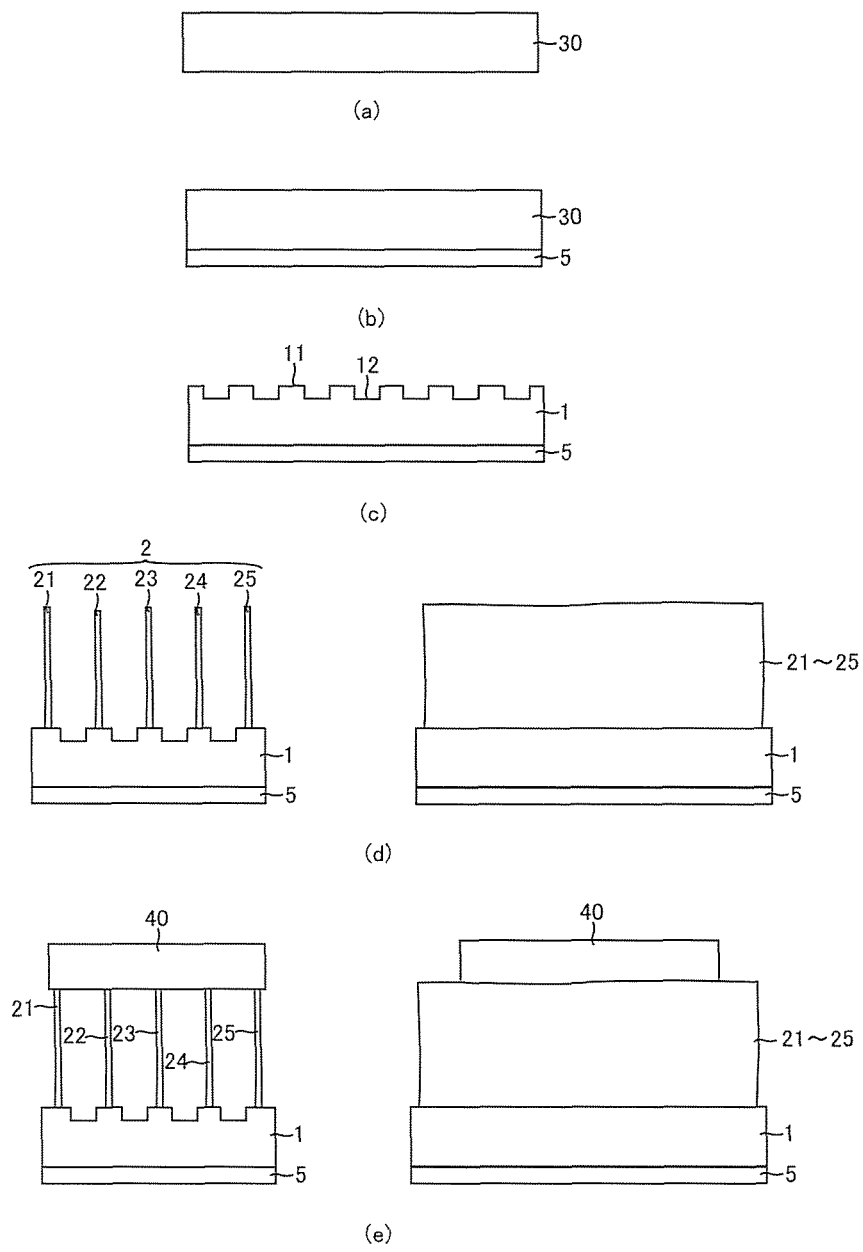
FIG. 7 is the first process chart illustrating a production method of the thin film transistor shown in FIGS. 1 and 2.
Figure 8:
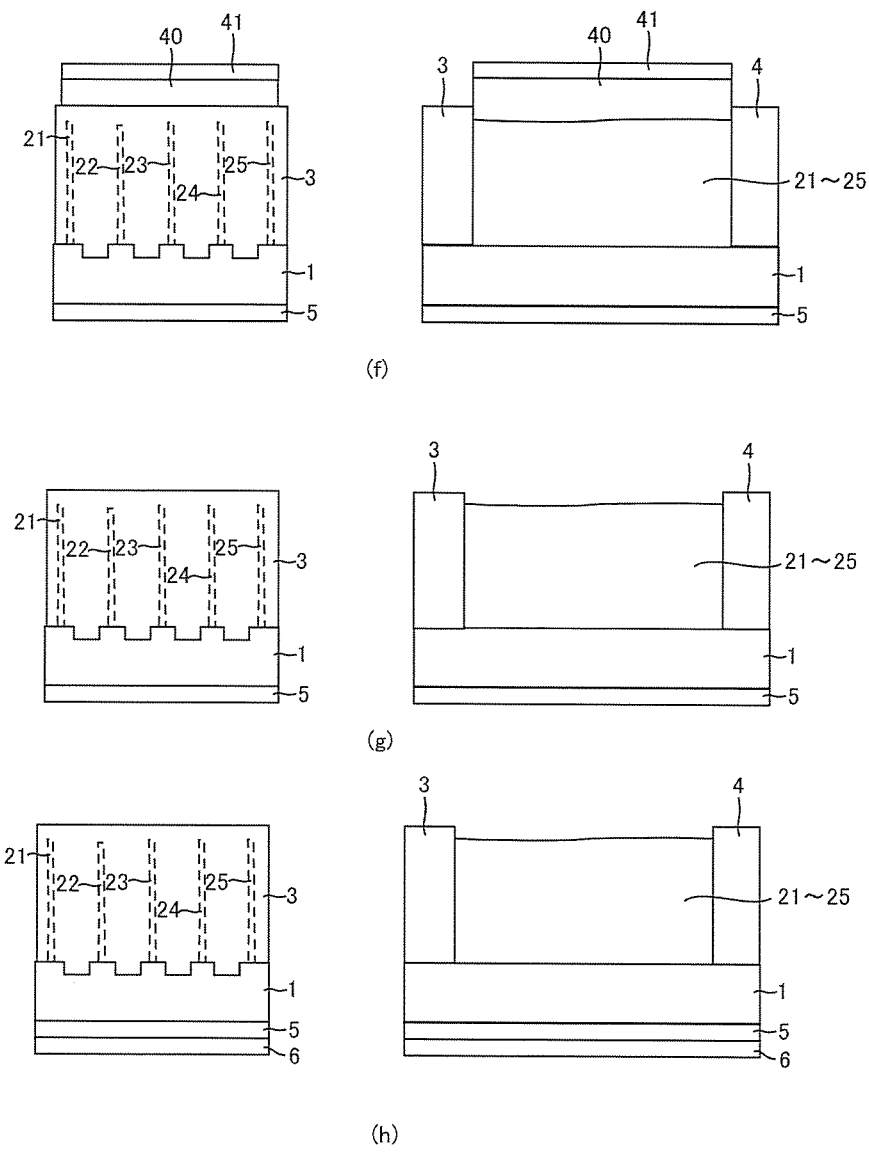
FIG. 8 is the second process chart illustrating a production method of the thin film transistor shown in FIGS. 1 and 2.

FIG. 7 and FIG. 8 are respectively the first and the second process charts illustrating a production method of the thin film transistor shown in FIGS. 1 and 2.

In Steps (d) to (h), a side view as seen from the length direction of the protruding portion 11 and a side view as seen from the direction perpendicular to the length direction of the protruding portion 11 are shown.

Referring to FIG. 7, when the production of the thin film transistor 10 begins, a silicon substrate 30 composed of n-type polycrystalline silicon is washed with ethanol, etc. for degreasing, and then, the silicon substrate 30 is washed with hydrofluoric acid (HF) (refer to Step (a)). Thereby, the surface of the silicon substrate 30 is terminated by hydrogen.

Then, the insulating film 5 composed of $SiO_2$ is formed by thermally oxidizing the back surface of the silicon substrate 30 (refer to Step (b)). In this case, the thermal oxidation is performed by, for example, heat-treating the silicon substrate 30 at 1,000° C. in the atmosphere of oxygen ($O_2$) gas.

After Step (b), one main surface of the silicon substrate 30 (=a surface opposite to the surface on which the insulating film 5 is formed) is patterned by electron beam lithography, and the one main surface of the silicon substrate 30 is etched by reactive ion etching so that the protruding portions 11 and the recessed portions 12 are formed on the one main surface of the silicon substrate 30 (refer to Step (c)). Thereby, the silicon substrate 1 is formed.

In this case, a resist is applied on the one main surface of the silicon substrate 30, and a resist pattern is formed by patterning the applied resist by electron beam lithography, and the one main surface of the silicon substrate 30 is etched by reactive ion etching, using the resist pattern as a mask.

After Step (c), the silicon substrate 1 is disposed on the holder 32 inside the vacuum container 20, and the temperature of the silicon substrate 1 is raised to 400 to 600° C. by using the heater 34. The gas introducing part 28 supplies 50 sccm of $CH_4$ gas and 50 sccm of $H_2$ gas, or 100 sccm of $CH_4$ gas, to the inside of the vacuum container 20. That is, material gas including carbon atoms is introduced to the inside of the vacuum container 20. Then, the pressure inside the vacuum container 20 is adjusted to 1.33 Pa.

After that, the high-frequency power source 62 applies 1 kW high-frequency power having a frequency of 13.56 MHz to the plane conductor 50 via the matching circuit 64 and the connection conductor 68.

Thereby, the plasma 70 is generated inside the vacuum container 20, and the carbon nanowall thin films 21 to 25 are formed in a self-organizing manner on the protruding portions 11 of the silicon substrate 1. In this case, the formation time of the carbon nanowall thin films 21 to 25 is 10 to 30 minutes.

After 10 to 30 minutes from the beginning of applying the high-frequency power, the application of the high-frequency power is halted, and the supply of $CH_4$ gas and $H_2$ gas (or $CH_4$ gas) is halted. In this way, the carbon nanowall thin films 21 to 25 are formed by using the induction coupled plasma.

After Step (d), a resist is applied on the carbon nanowall thin films 21 to 25, and a resist pattern 40 is formed by patterning the applied resist by photo lithography (refer to Step (e)).

Referring to FIG. 8, after Step (e), Ti and Au are successively laminated on the carbon nanowall thin films 21 to 25 and the resist pattern 40 by electronic beam evaporation. Thereby, the source electrode 3 and the drain electrode 4 are formed (refer to Step (f)). In this case, a metal layer 41 is formed on the resist pattern 40.

After that, the resist pattern 40 is removed by using 1-methyl-2-pyrrolidone (refer to Step (g)). Thereby, the metal layer 41 is removed by lift-off.

Then, the gate electrode 6 is formed by successively laminating Ti and Au on the insulating film 5 by electronic beam evaporation. Thereby, the production of the thin film transistor 10 is completed (refer to Step (h)).

Figure 9:
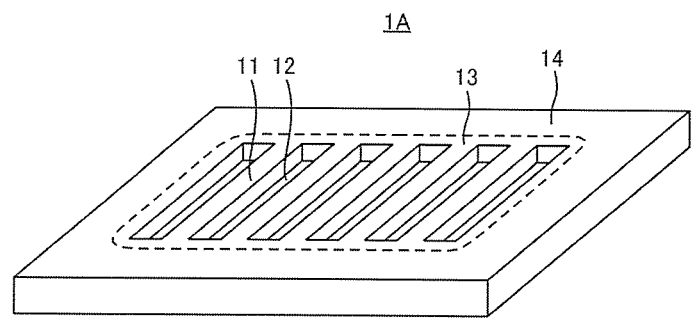
FIG. 9 is a perspective view illustrating another silicon substrate in the first embodiment.

FIG. 9 is a perspective view illustrating another silicon substrate in the first embodiment. In the first embodiment, a silicon substrate 1A shown in FIG. 9 may be used.

Referring to FIG. 9, the silicon substrate 1A is made of the same material as the silicon substrate 1, and has regions 13 and 14. The region 13 is provided on the inner periphery side of the region 14, and has the protruding portions 11 and the recessed portions 12 mentioned above. The region 13 is the region where the thin film transistor is formed. The region 14 has a flat surface.

Figure 10:
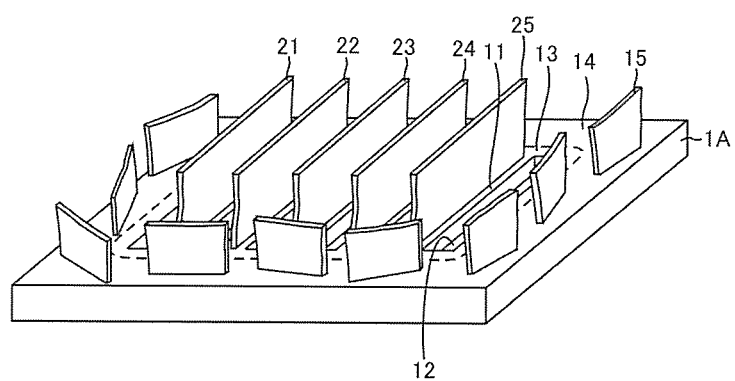
FIG. 10 is a schematic diagram of carbon nanowall thin films formed on the silicon substrate shown in FIG. 9.

FIG. 10 is a schematic diagram of the carbon nanowall thin films formed on the silicon substrate 1A shown in FIG. 9.

Referring to FIG. 10, when carbon nanowall thin films are formed on the silicon substrate 1A by using the plasma apparatus 100 shown in FIG. 4, the plurality of carbon nanowall thin films 21 to 25 are formed on the protruding portions 11 along the length direction of the protruding portion 11 (i.e. formed with orientation) in the region 13, and the carbon nanowall thin films 15 are formed in a random direction in the region 14.

Accordingly, when producing the thin film transistor 10 in the region 13, if the carbon nanowall thin films 15 exist in the region 14, the electrical characteristics of the thin film transistor 10 can be deteriorated.

Therefore, when producing the thin film transistor 10 in the region 13, the carbon nanowall thin films 15 in the region 14 are removed, and then, the thin film transistor 10 is produced in the region 13.

Figure 11:
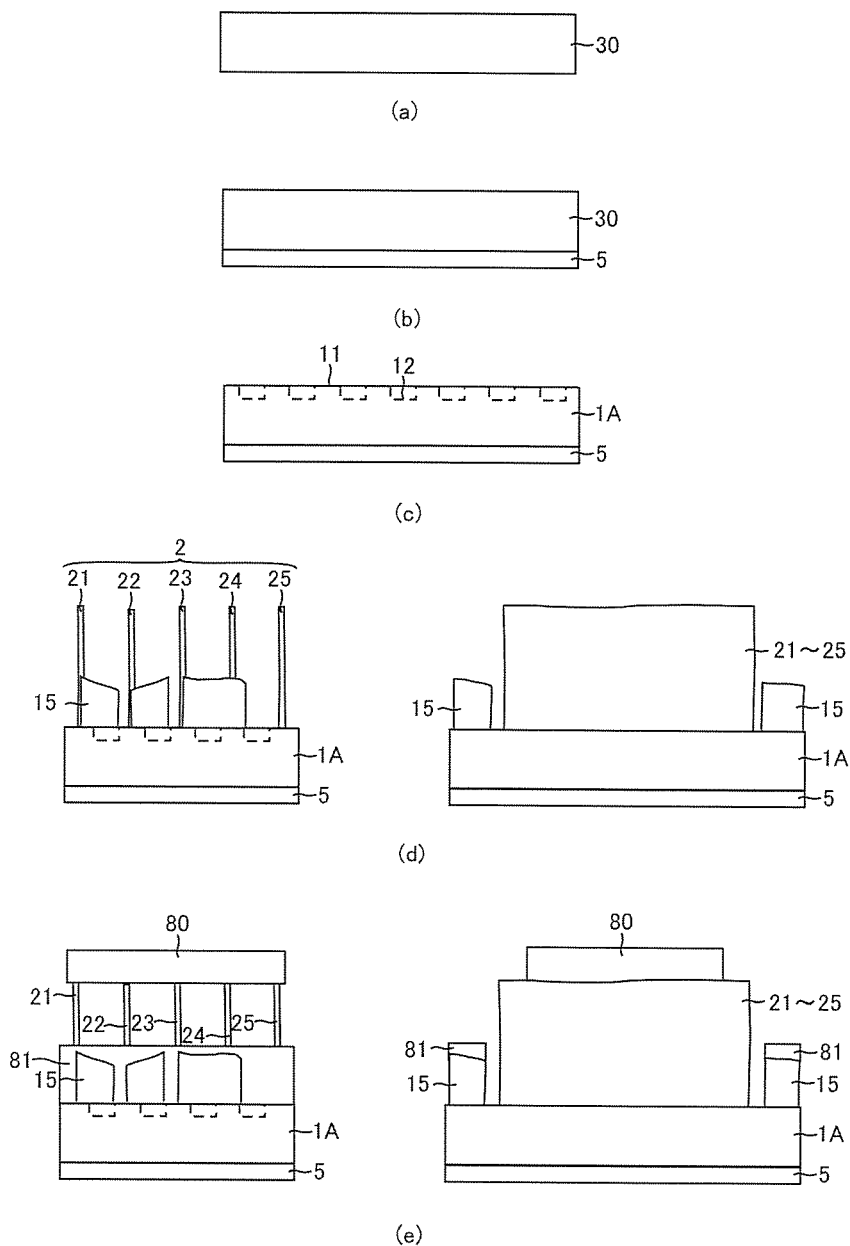
FIG. 11 is the first process chart illustrating a production method when the silicon substrate shown in FIG. 9 is used.
Figure 12:
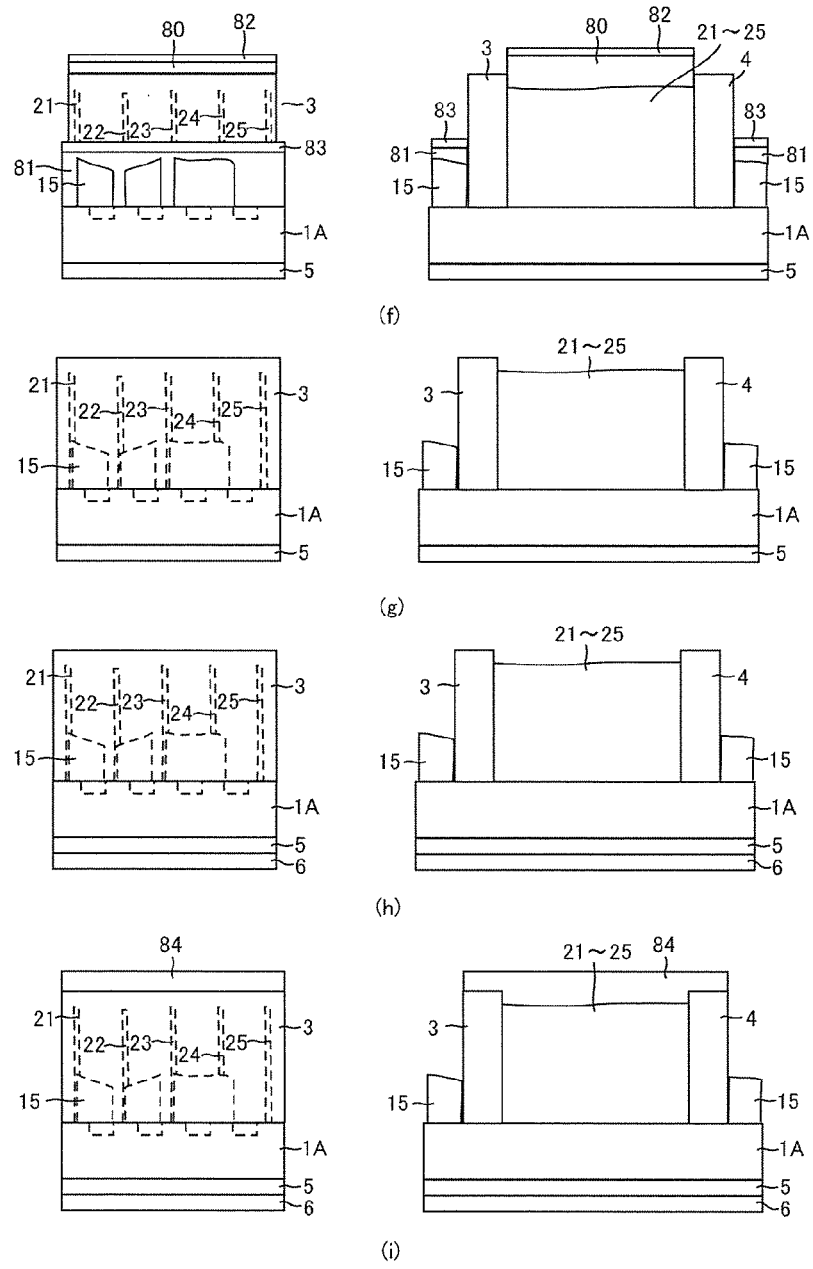
FIG. 12 is the second process chart illustrating a production method when the silicon substrate shown in FIG. 9 is used.
Figure 13:
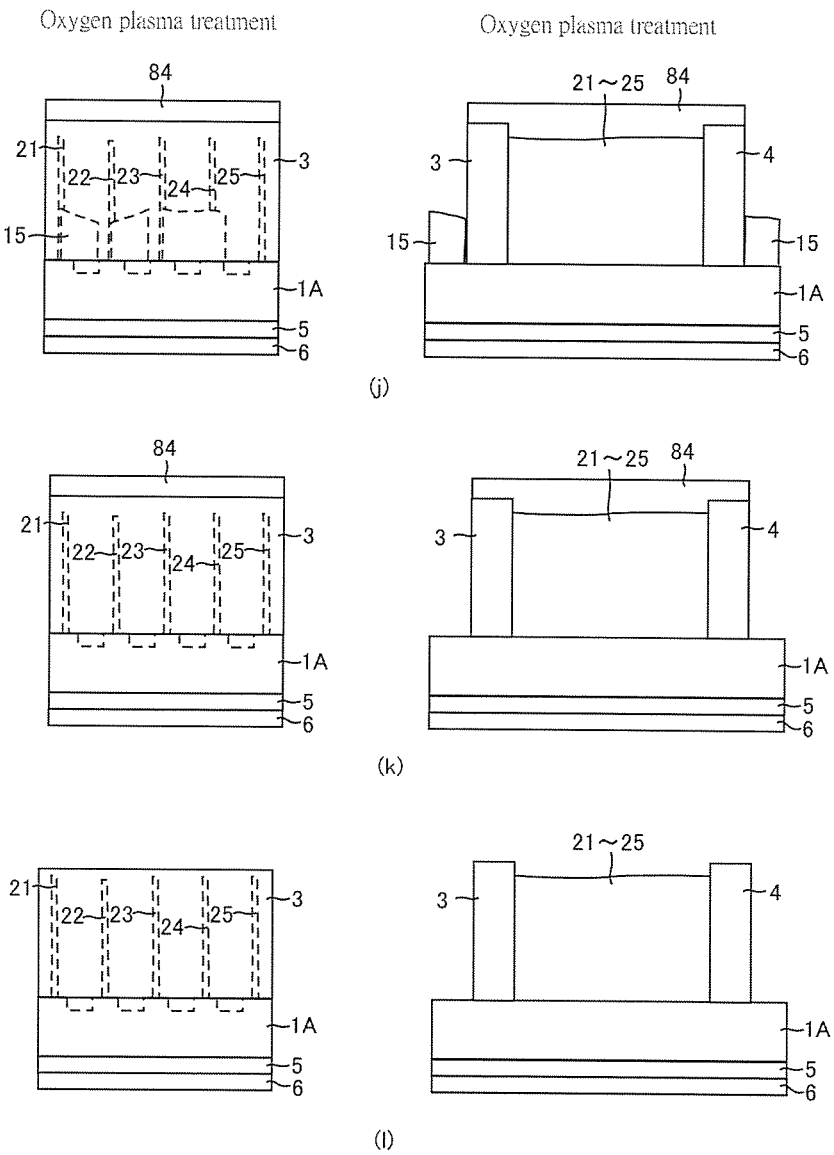
FIG. 13 is the third process chart illustrating a production method when the silicon substrate shown in FIG. 9 is used.

FIGS. 11 to 13 are respectively the first to the third process charts illustrating a production method of the thin film transistor 10 when the silicon substrate 1A shown in FIG. 9 is used.

In Steps (d) to (k), a side view as seen from the length direction of the protruding portion 11 and a side view as seen from the direction perpendicular to the length direction of the protruding portion 11 are shown.

Referring to FIG. 11, when the production of the thin film transistor 10 using the silicon substrate 1A begins, the same processes as Steps (a) and (b) are sequentially performed (refer to Steps (a) and (b)).

After Step (b), the one main surface of the silicon substrate 30 (=a surface opposite to the surface on which the insulating film 5 is framed) is patterned by electron beam lithography, and the one main surface of the silicon substrate 30 is etched by reactive ion etching so that the protruding portions 11 and the recessed portions 12 are formed on the one main surface of the silicon substrate 30 with a flat portion remaining in the periphery of the silicon substrate 30 (refer to Step (c)). Thereby, the silicon substrate 1A is formed.

In this case, a resist is applied on the one main surface of the silicon substrate 30, and a resist pattern is formed by patterning the applied resist by electron beam lithography, and the one main surface of the silicon substrate 30 is etched by reactive ion etching, using the formed resist pattern as a mask, such that the flat portion remains in the periphery of the silicon substrate 30.

After Step (c), the silicon substrate 1A is disposed on the holder 32 inside the vacuum container 20, and the carbon nanowall thin films 15 and 21 to 25 are formed on the silicon substrate 1A by the same conditions as Step (d) shown in FIG. 7 (refer to Step (d)). In this case, the carbon nanowall thin films 21 to 25 are formed on the protruding portions 11 in the region 13 of the silicon substrate 1A, and the carbon nanowall thin films 15 are formed in the region 14 (the flat portion) of the silicon substrate 1A.

After Step (d), a resist is applied on the carbon nanowall thin films 21 to 25 and the region 14 except the both end portions in the length direction of the protruding portion 11, and resist patterns 80 and 81 are formed by patterning the applied resist by photo lithography (refer to Step (e)).

Referring to FIG. 12, after Step (e), Ti and Au are successively laminated on the carbon nanowall thin films 21 to 25 and the resist patterns 80 and 81 by electronic beam evaporation. Thereby, the source electrode 3 and the drain electrode 4 are formed (refer to Step (0). In this case, a metal layer 82 is formed on the resist pattern 80, and a metal layer 83 is formed on the resist pattern 81.

After that, the resist patterns 80 and 81 are removed by using 1-methyl-2-pyrrolidone (refer to Step (g)). Thereby, the metal layers 82 and 83 are removed by lift-off.

Then, Ti and Au are successively laminated on the insulating film 5 by electronic beam evaporation, and the gate electrode 6 is formed (refer to Step (h)).

Next, a resist is applied so as to cover the region 13, and a resist pattern 84 is formed by patterning the applied resist by photo lithography (refer to Step (i)).

Referring to FIG. 13, after Step (i), the gas introducing part 28 supplies 60 sccm of oxygen ($O_2$) to the inside of the vacuum container 20. Then, the pressure inside the vacuum container 20 is adjusted to 4.5 Pa.

Then, the high-frequency power source 62 applies 100 W high-frequency power having a frequency of 13.56 MHz to the plane conductor 50 via the matching circuit 64 and the connection conductor 68.

Thereby, the plasma 70 is generated inside the vacuum container 20, and the region 14 of the silicon substrate 1A is processed by oxygen plasma using the resist pattern 84 as a mask (refer to Step (j)). In this case, the processing time of oxygen plasma is, for example, 3 minutes.

Thereby, the carbon nanowall thin films 15 formed on the region 14 are removed (refer to Step (k)).

After Step (k), the resist pattern 84 is removed by using 1-methyl-2-pyrrolidone. Thereby, the production of thin film transistor 10 is completed (refer to Step (l)).

As described above, the carbon nanowall thin films 15 formed in the region 14 are removed by using the oxygen plasma, and the thin film transistor 10 is formed in the region 13.

In the process charts shown in FIGS. 11 to 13, it is described that the carbon nanowall thin films 15 formed on the region 14 are removed by oxygen plasma after the source electrode 3, the drain electrode 4 and the gate electrode 6 are formed. However, the first embodiment is not limited thereto and the thin film transistor 10 may be produced by forming the source electrode 3, the drain electrode 4 and the gate electrode 6 after removing the carbon nanowall thin films 15 formed on the region 14.

Figure 14:
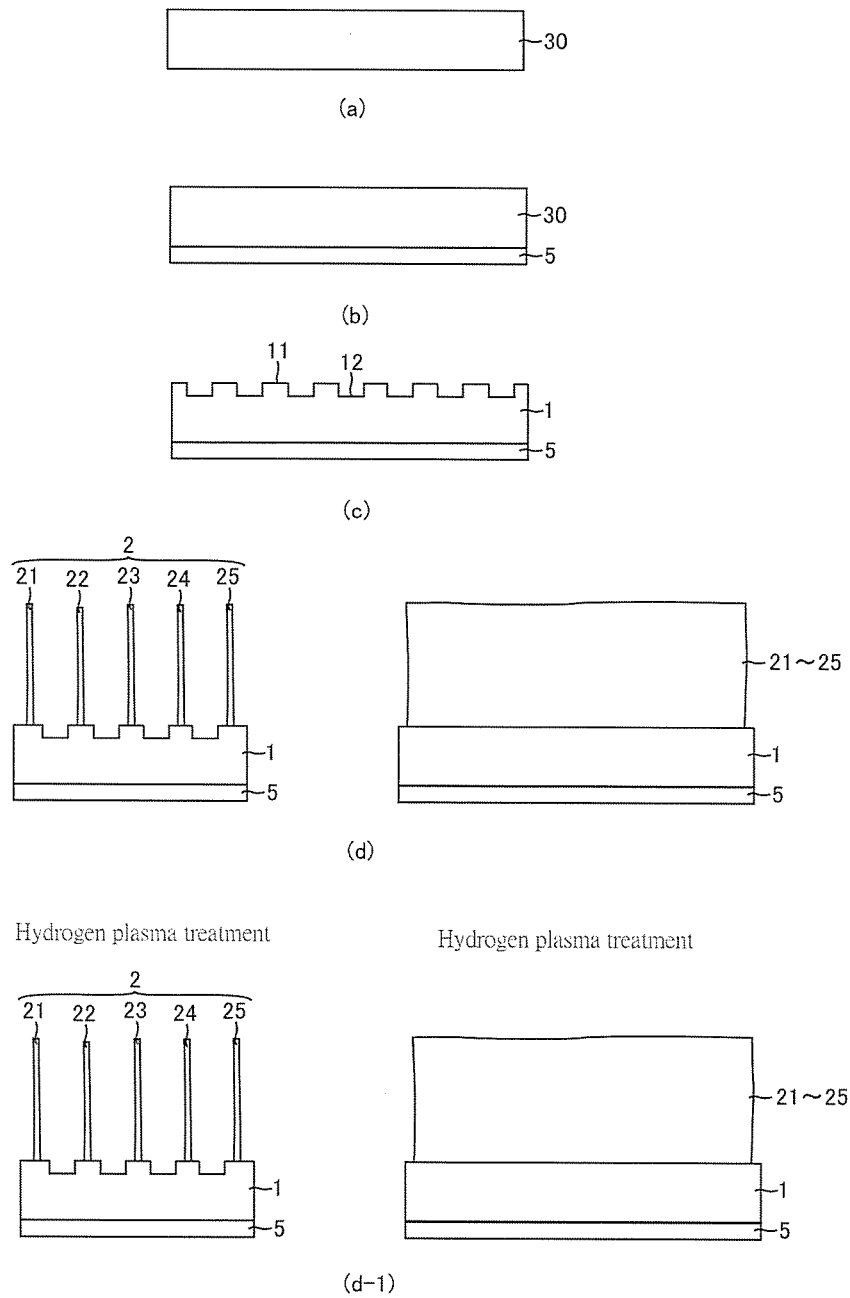
FIG. 14 is the first process chart illustrating another production method of the thin film transistor shown in FIGS. 1 and 2.
Figure 15:
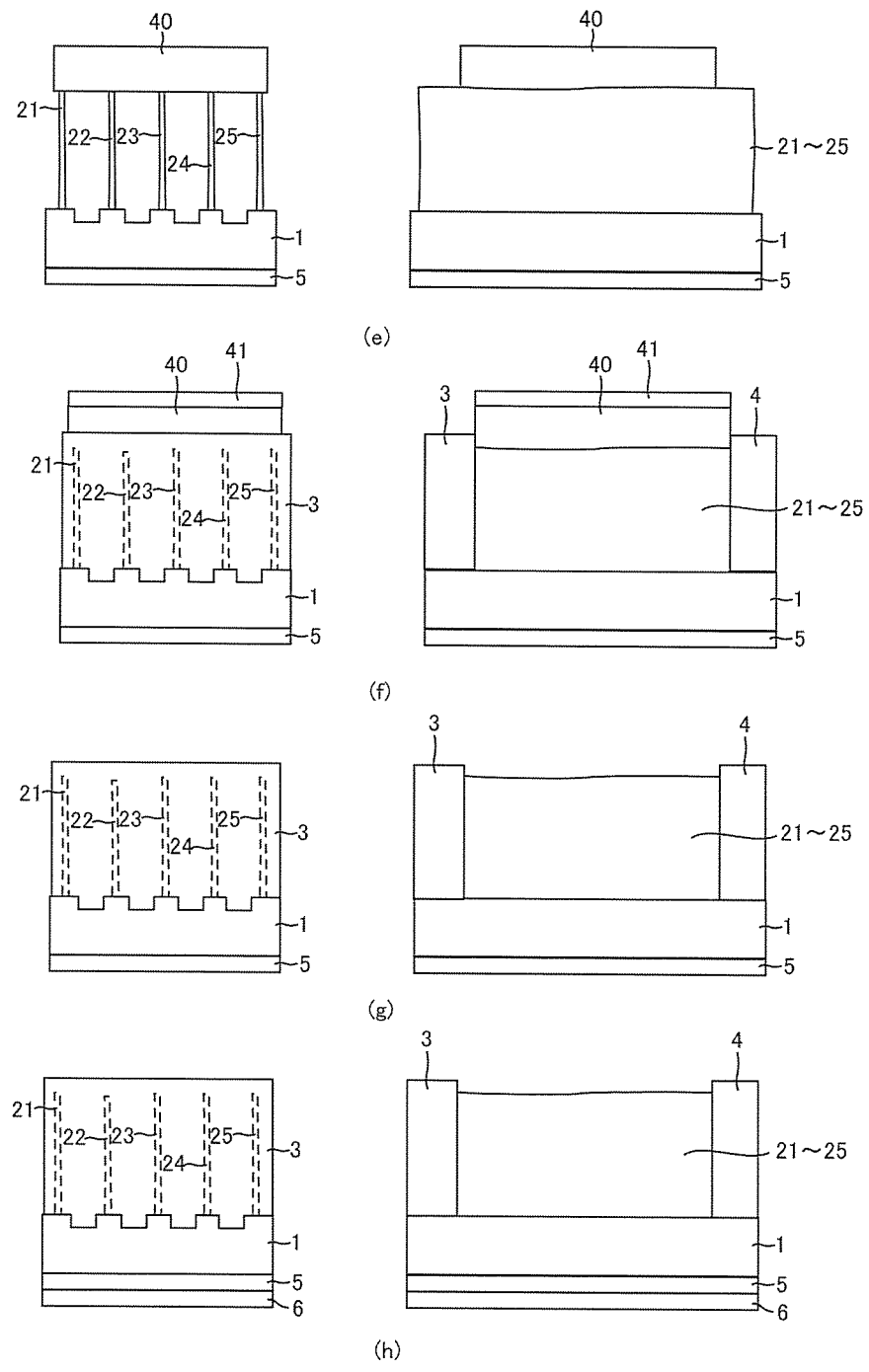
FIG. 15 is the second process chart illustrating another production method of the thin film transistor shown in FIGS. 1 and 2.

FIGS. 14 and 15 are respectively the first and the second process charts illustrating another production method of the thin film transistor 10.

In Steps (d), (d-1) and (e) to (h), a side view as seen from the length direction of the protruding portion 11 and a side view as seen from the direction orthogonal to the length direction of the protruding portion 11 are shown.

The process charts shown in FIGS. 14 and 15 are the same as the process charts shown in FIGS. 7 and 8 except that Step (d-1) is added between Step (d) and Step (e) shown in FIGS. 7 and 8.

Referring to FIG. 14, when the production of the thin film transistor 10 begins, the abovementioned Steps (a) to (d) are sequentially performed.

Then, after Step (d), the gas introducing part 28 supplies 100 sccm of hydrogen ($H_2$) to the inside of the vacuum container 20. Then, the pressure inside the vacuum container 20 is adjusted to 6.65 Pa.

After that, the high-frequency power source 62 applies 1 kW high-frequency power having a frequency of 13.56 MHz to the plane conductor 50 via the matching circuit 64 and the connection conductor 68.

Thereby, the plasma 70 is generated inside the vacuum container 20, and the surfaces of the carbon nanowall thin films 21 to 25 are processed by hydrogen plasma (refer to Step (d-1)). In this case, the processing time of hydrogen plasma is, for example, 1 minute.

After Step (d-1), the abovementioned Steps (e) to (h) are sequentially performed, and the production of the thin film transistor 10 is completed (refer to Steps (e) to (h) of FIG. 15).

As described above, the thin film transistor 10 is produced by forming the source electrode 3 and the drain electrode 4 after the surfaces of the carbon nanowall thin films 21 to 25 formed on the silicon substrate 1 are processed by hydrogen plasma.

In the first embodiment, the thin film transistor 10 may be produced by adding Step (d-1) shown in FIG. 14 between Steps (d) and (e) shown in FIG. 11 to FIG. 13.

The thin film transistor 10 is described in detail below using examples.

Example 1

The thin film transistor 10A of the example 1 was produced by using Steps (a) to (h) shown in FIGS. 7 and 8, and the substrate temperature Is was set at 400° C. when the carbon nanowall thin films 21 to 25 were formed in Step (d).

Example 2

The thin film transistor 10B of the example 2 was produced in the same way as the example 1 except that the substrate temperature Ts was set at 500° C. when the carbon nanowall thin films 21 to 25 were formed in Step (d).

Example 3

The thin film transistor 10C of the example 3 was produced in the same way as the example 1 except that the substrate temperature Ts was set at 600° C. when the carbon nanowall thin films 21 to 25 were formed in Step (d).

Example 4

The thin film transistor 10D of the example 4 was produced by using Steps (a) to (l) shown in FIGS. 11 to 13. In this case, the substrate temperature Ts was 500° C. when the carbon nanowall thin films 21 to 25 were formed.

Example 5

The thin film transistor 10E of the example 5 was produced by using Steps (a) to (d), (d-1) and (e) to (h) shown in FIGS. 14 and 15. In this case, the substrate temperature Ts was 600° C. when the carbon nanowall thin films 21 to 25 were formed.

Example 6

The thin film transistor 10F of the example 6 was produced by using Steps (a) to (h) shown in FIGS. 7 and 8 except that the carbon nanowall thin films 21 to 25 were formed by setting the substrate temperature Ts at 400° C. and then setting the substrate temperature Ts at 600° C.

Figure 16:
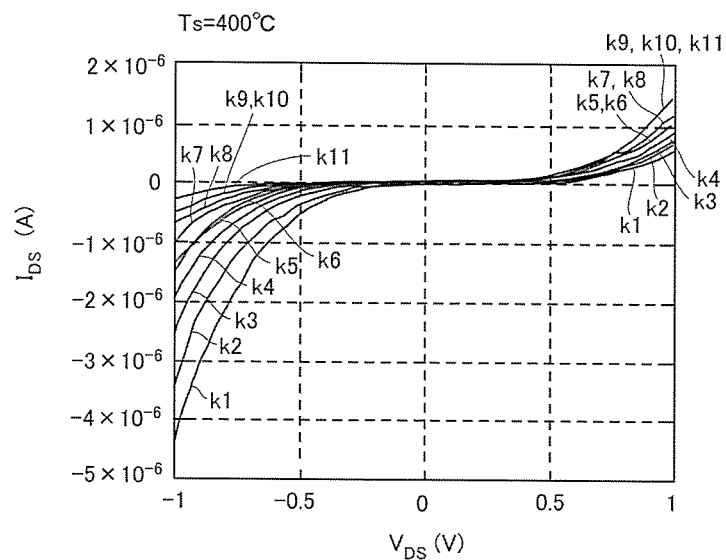
FIG. 16 is a diagram illustrating the electrical characteristics of the thin film transistor in the example 1.

FIG. 16 is a diagram illustrating the electrical characteristics of the thin film transistor 10A in the example 1. In FIG. 16, the vertical axis represents the electric current $I_{DS}$ flowing between the source electrode 3 and the drain electrode 4, and the horizontal axis represents the voltage $V_{DS}$ applied between the source electrode 3 and the drain electrode 4.

Curves k1 to k11 respectively indicate the relationship between the electric current $I_{DS}$ and the voltage $V_{DS}$ when the gate voltage is 5, 4, 3, 2, 1, 0, −1, −2, −3, −4, and −5V.

Referring to FIG. 16, the electric current $I_{DS}$ increases at each gate voltage in accordance with the voltage $V_{DS}$ increasing from −1V to +1V (refer to the curves k1 to k11).

The electric current $I_{DS}$ increases at the same voltage as the voltage $V_{DS}$ in accordance with the gate voltage changing from +5V to −5V (refer to the curves k1 to k11).

Accordingly, it is experimentally proven that the carbon nanowall thin films 21 to 25 formed with the substrate temperature Ts at 400° C. have semiconductor characteristics and can be used as the channel layer of the thin film transistor.

Figure 17:
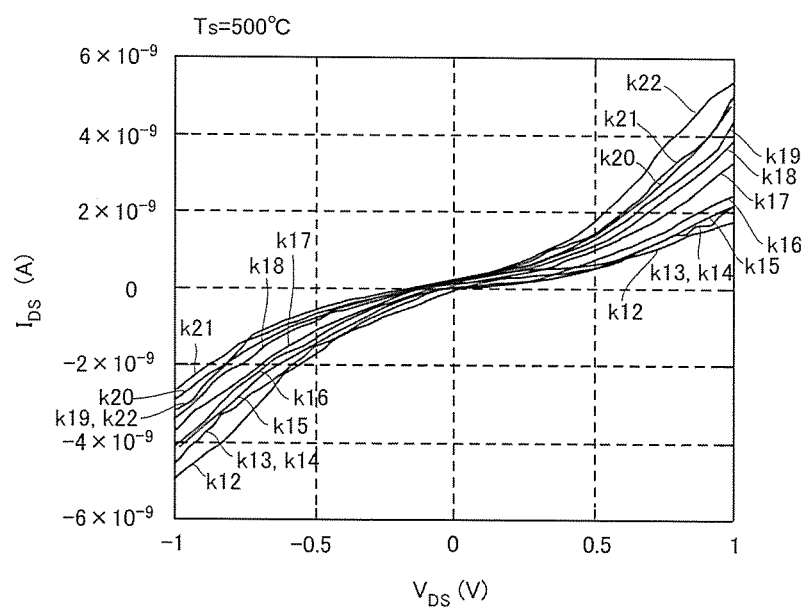
FIG. 17 is a diagram illustrating the electrical characteristics of the thin film transistor in the example 2.

FIG. 17 is a diagram illustrating the electrical characteristics of the thin film transistor 10B in the example 2. In FIG. 17, the vertical axis represents the electric current $I_{DS}$ flowing between the source electrode 3 and the drain electrode 4, the horizontal axis represents the voltage $V_{DS}$ applied between the source electrode 3 and the drain electrode 4.

Curves k12 to k22 respectively indicate the relationship between the electric current $I_{DS}$ and the voltage $V_{DS}$ when the gate voltage is 5, 4, 3, 2, 1, 0, −1, −2, −3, −4, and −5V.

Referring to FIG. 17, the electric current $I_{DS}$ increases at each gate voltage in accordance with the voltage $V_{DS}$ increasing from −1V to +1V (refer to the curves k12 to k22), though the current voltage characteristics $I_{DS}$-$V_{DS}$ is inferior to the current voltage characteristics $I_{DS}$-$V_{DS}$ shown in FIG. 16.

The electric current $I_{DS}$ increases at the same voltage as the voltage $V_{DS}$ in accordance with the gate voltage changing from +5V to −5V (refer to the curves k12 to k22).

Accordingly, it is experimentally proven that the carbon nanowall thin films 21 to 25 formed with the substrate temperature Ts at 500° C. also have semiconductor characteristics and can be used as the channel layer of the thin film transistor.

The thin film transistor 10C of the example 3 which has the substrate temperature Ts of 600° C. when the carbon nanowall thin films 21 to 25 are formed has electrical characteristics equivalent to those of the thin film transistors 10A and 10B. It is considered that as the substrate temperature becomes 600° C., which is higher than 400° C. and 500° C., the crystallinity of the carbon nanowall thin films 21 to 25 is improved, and thus the carbon nanowall thin films 21 to 25 formed with the substrate temperature Ts at 600° C. also have semiconductor characteristics.

Accordingly, in the first embodiment, the carbon nanowall thin films 21 to 25 are formed using the substrate temperature Ts in the range of 400° C. to 600° C.

Figure 18:
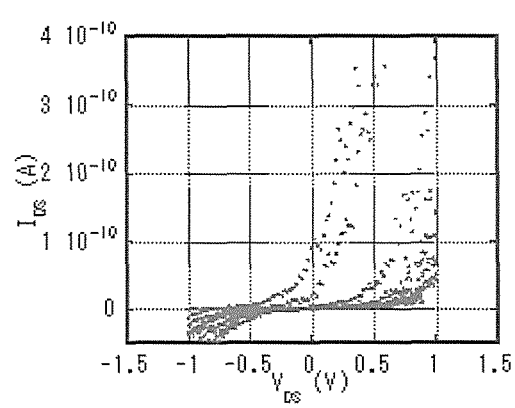
FIG. 18 is a diagram illustrating the electrical characteristics of the thin film transistor in the example 4.

FIG. 18 is a diagram illustrating the electrical characteristics of the thin film transistor 10 D in the example 4. In FIG. 18, the vertical axis represents the electric current $I_{DS}$ flowing between the source electrode 3 and the drain electrode 4, the horizontal axis represents the voltage $V_{DS}$ applied between the source electrode 3 and the drain electrode 4. The gate voltage is +5V to −5V.

Referring to FIG. 18, the electric current $I_{DS}$ increases exponentially when the voltage $V_{DS}$ becomes equal to or greater than 0V or equal to or greater than 0.5V.

The substrate temperature Ts is 500° C. when the carbon nanowall thin films 21 to 25 are formed. After the carbon nanowall thin films 21 to 25 are formed, when the carbon nanowall thin films 15 formed in the region 14, other than the region 13 in which the thin film transistor 10 is formed, are not removed by using oxygen plasma, the current voltage characteristics $I_{DS}$-$V_{DS}$ of the thin film transistor becomes the current voltage characteristics $I_{DS}$-$V_{DS}$ shown in FIG. 17.

In contrast, the thin film transistor 10D in the example 4 was produced by forming the carbon nanowall thin films 21 to 25 using the substrate temperature Ts at 500° C., and removing the carbon nanowall thin films 15 formed in the region 14 by oxygen plasma.

As shown in FIG. 18, the thin film transistor 10D has current voltage characteristics $I_{DS}$-$V_{DS}$ superior to the current voltage characteristics $I_{DS}$-$V_{DS}$ shown in FIG. 17.

As opposed to that the leakage current of the thin film transistor is 10 μA when the carbon nanowall thin films formed in the region 14 are not removed by using oxygen plasma, the leakage current of the thin film transistor is 100 pA when the carbon nanowall thin films formed in the region 14 are removed by using oxygen plasma.

Accordingly, the leakage current can be significantly reduced by removing the carbon nanowall thin films 15 formed in the region 14 by oxygen plasma, and as a result, the current voltage characteristics $I_{DS}$-$V_{DS}$ can be significantly improved.

Figure 19:
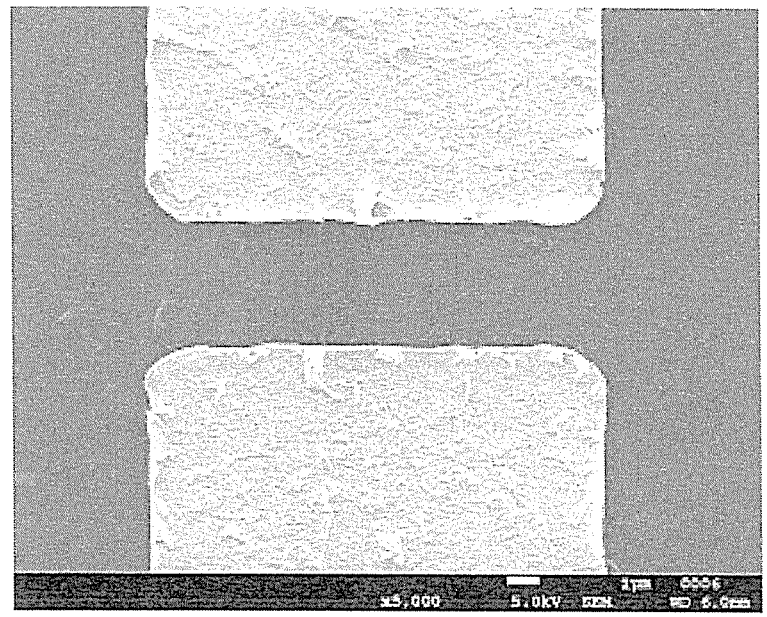
FIGS. 19A and 19B are SEM photographs of a region where electrodes of the thin film transistor are formed.
Figure 19:
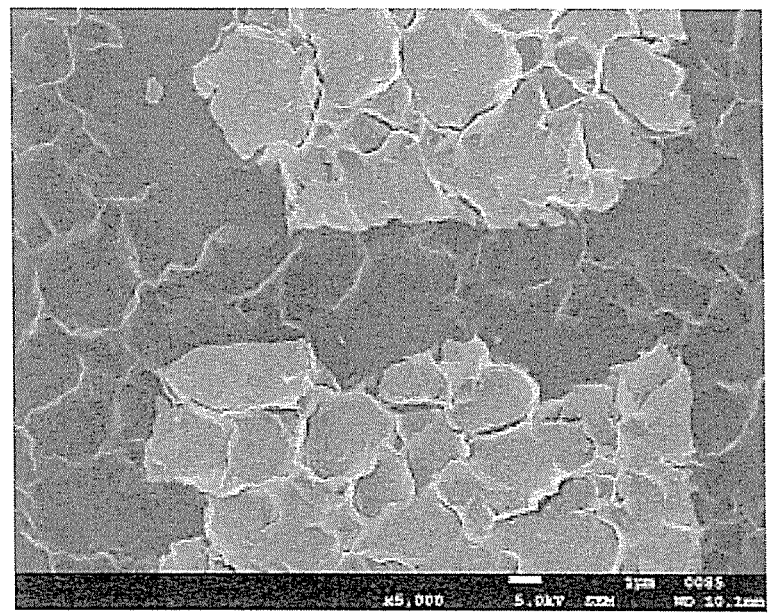

FIGS. 19(a) and 19(b) are SEM (Scanning Electron Microscope) photographs of a region where electrodes (the source electrode or the drain electrode) of the thin film transistor are formed.

FIG. 19(a) shows an SEM photograph when the carbon nanowall thin films are not processed by hydrogen plasma, and FIG. 19(b) shows an SEM photograph when the carbon nanowall thin films are processed by hydrogen plasma.

When the carbon nanowall thin films are not processed by hydrogen plasma, the electrodes are formed as films and placed on the carbon nanowall thin films (refer to FIG. 19(a)).

In contrast, when the carbon nanowall thin films are processed by hydrogen plasma, the electrodes are formed to be following up the shape of the base material, i.e. the carbon nanowall thin films, and the adhesion between the electrodes and the carbon nanowall thin films can be enhanced (refer to FIG. 19(b)).

Accordingly, in the thin film transistor 10E of the example 5, the adhesion between the source electrode 3 and the drain electrode 4 and the carbon nanowall thin films 21 to 25 can be enhanced. It is considered that, as a result, the thin film transistor 10E has superior current voltage characteristics $I_{DS}$-$V_{DS}$.

Figure 20:
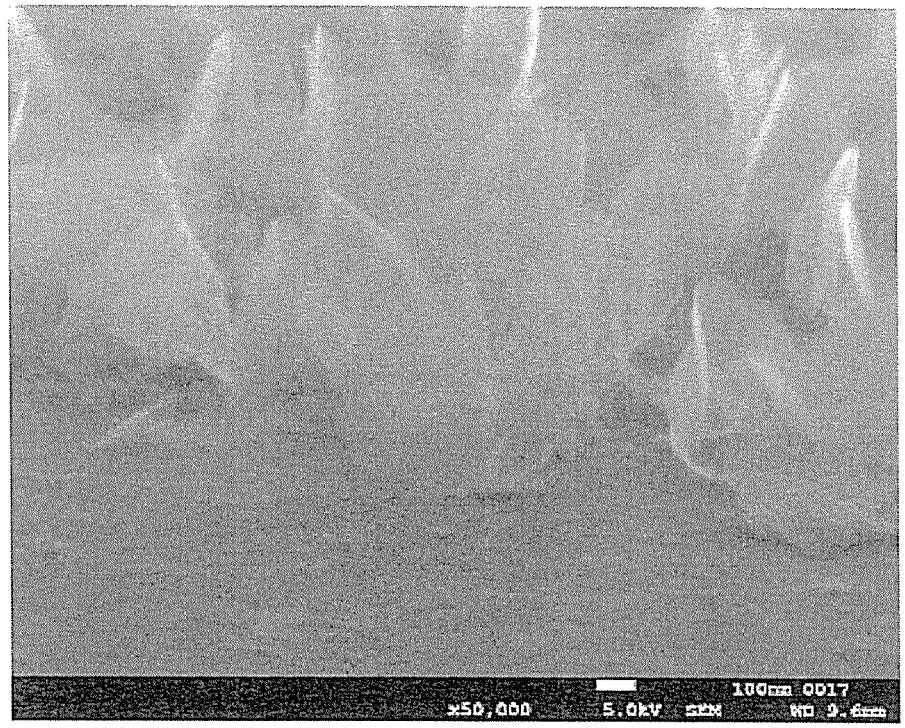
FIGS. 20A and 20B are SEM photographs of the cross section of the carbon nanowall thin film.
Figure 20:
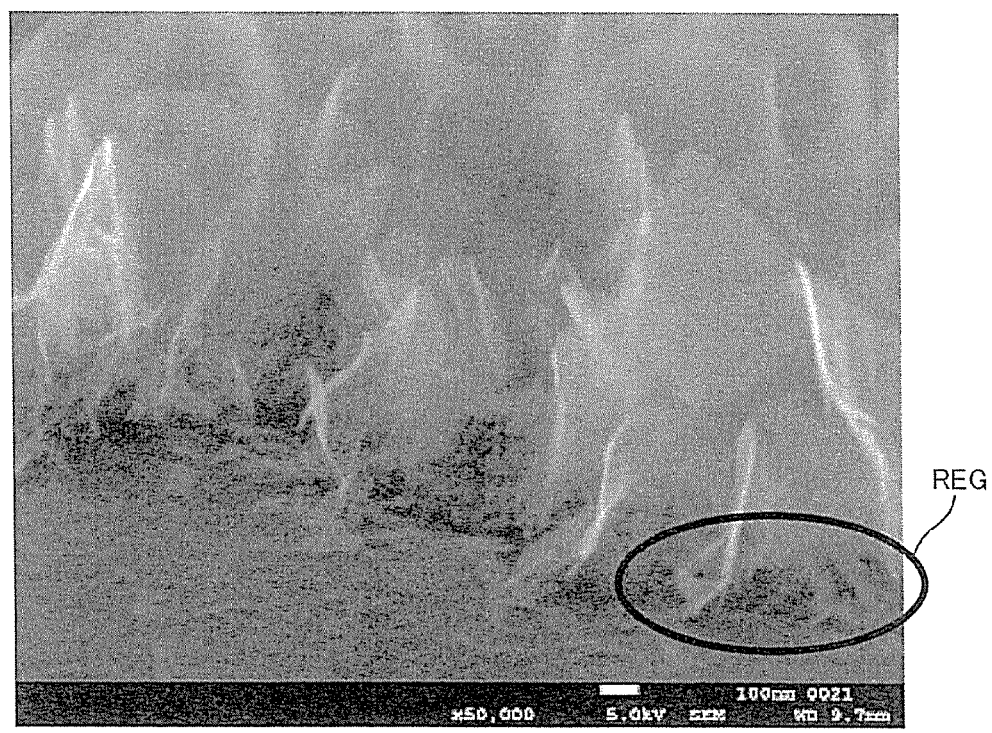

FIG. 20 is SEM photographs of the cross section of the carbon nanowall thin films. FIG. 20(a) shows a cross-sectional SEM photograph of the carbon nanowall thin films formed by using the substrate temperature Ts of 600° C., and FIG. 20(b) shows a cross-sectional SEM photograph of the carbon nanowall thin films formed by first using the substrate temperature Is of 400° C. and then increasing the substrate temperature Ts to 600° C.

When the carbon nanowall thin films are formed by using the substrate temperature Ts of 600° C., the carbon nanowall thin films grow uniformly from the substrate (refer to FIG. 20(a)).

In contrast, when the substrate temperature TS is increased by two steps, to 400° C. and then to 600° C., two different carbon nanowall thin films grow in the direction perpendicular to the substrate (refer to FIG. 20(b)). That is, there exist the carbon nanowall thin films grown at the substrate temperature Ts of 400° C. in the region REG, and the carbon nanowall thin films grown at the substrate temperature Ts of 600° C. are continuously formed thereon.

The carbon nanowall thin films grown at the substrate temperature Ts of 400° C. have semiconductor characteristics as shown in FIG. 16. When the substrate temperature Ts is increased from 400° C. to 600° C., the growing speed of the carbon nanowall thin films becomes faster, and thus the carbon nanowall thin films having semiconductor characteristics can be formed in a short time by switching the substrate temperature Ts in two steps, i.e. 400° C. and 600° C. As a result, the surplus carbonate can be reduced, and also the damage to the carbon nanowall thin films due to etching can be reduced.

Accordingly, it is considered that the thin film transistor 10F of the example 6 has superior current voltage characteristics $I_{DS}$-$V_{DS}$.

As described above, the thin film transistors 10A, 10B, 10C, 10D, 10E and 10F in the examples 1 to 6 have a structure in which the carbon nanowall thin films 21 to 25 are disposed in parallel between the source electrode 3 and the drain electrode 4, and have superior current voltage characteristics $I_{DS}$-$V_{DS}$.

Accordingly, it is possible to pass larger electric current through the channel layer 2 of the thin film transistor 10 compared to the case that the channel layer 2 is comprised of a single carbon nanowall thin film.

Figure 21:
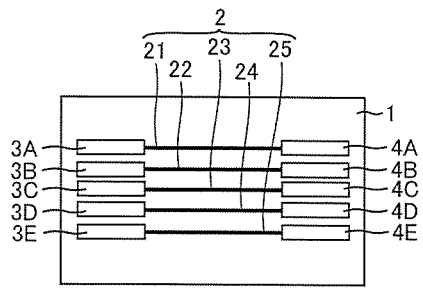
FIG. 21 is a plan view illustrating the structure of another thin film transistor in the first embodiment.

FIG. 21 is a plan view illustrating another thin film transistor in the first embodiment. The thin film transistor of the first embodiment may be the thin film transistor 10-1 shown in FIG. 21.

Referring to FIG. 21, the thin film transistor 10-1 is the same as the thin film transistor 10 except that the source electrode 3 of the thin film transistor 10 shown in FIG. 1 and FIG. 2 is replaced with source electrodes 3A to 3E, and the drain electrode 4 is replaced with drain electrodes 4A to 4E.

The source electrodes 3A to 3E are provided respectively corresponding to the carbon nanowall thin films 21 to 25, and connected to one side of the carbon nanowall thin films 21 to 25 in the length direction of the protruding portion 11 of the silicon substrate 1.

The drain electrodes 4A to 4E are provided respectively corresponding to the carbon nanowall thin films 21 to 25, and connected to the other side of the carbon nanowall thin films 21 to 25 in the length direction of the protruding portion 11 of the silicon substrate 1.

Since the cross-sectional structure of the thin film transistor 10-1 is the same as the cross-sectional structure of the thin film transistor 10 shown in FIG. 1, the insulating film 5 and the gate electrode 6 of the thin film transistor 10-1 are formed to face the entire surface of the channel layer 2 on the silicon substrate 1 side.

Accordingly, in the thin film transistor 10-1, the carbon nanowall thin film 21, the source electrode 3A, the drain electrode 4A, the insulating film 5 and the gate electrode 6 constitute one thin film transistor; the carbon nanowall thin film 22, the source electrode 3B, the drain electrode 4B, the insulating film 5 and the gate electrode 6 constitute one thin film transistor; the carbon nanowall thin film 23, the source electrode 3C, the drain electrode 4C, the insulating film 5 and the gate electrode 6 constitute one thin film transistor; the carbon nanowall thin film 24, the source electrode 3D, the drain electrode 4D, the insulating film 5 and the gate electrode 6 constitute one thin film transistor; and the carbon nanowall thin film 25, the source electrode 3E, the drain electrode 4E, the insulating film 5 and the gate electrode 6 constitute one thin film transistor.

As a result, the thin film transistor 10-1 has a structure in which five thin film transistors are disposed in parallel in the in-plane direction of the silicon substrate 1.

The thin film transistor 10-1 is produced according to the process charts shown in FIGS. 7 and 8 with an additional process between Step (g) and Step (h) to form the source electrodes 3A, 3B, 3C, 3D and 3E and the drain electrodes 4A, 4B, 4C, 4D and 4E by etching a portion of the source electrode 3 and the drain electrode 4.

The thin film transistor 10-1 may be produced according to the process charts shown in FIGS. 11 to 13 with an additional process between Step (g) and Step (h) to form the source electrodes 3A, 3B, 3C, 3D and 3E and the drain electrodes 4A, 4B, 4C, 4D and 4E by etching a portion of the source electrode 3 and the drain electrode 4.

Further, the thin film transistor 10-1 may be produced according to the process charts shown in FIGS. 14 and 15 with an additional process between Step (g) and Step (h) to form the source electrodes 3A, 3B, 3C, 3D and 3E and the drain electrodes 4A, 4B, 4C, 4D and 4E by etching a portion of the source electrode 3 and the drain electrode 4.

In the thin film transistor 10-1, the source electrode and the drain electrode to be connected to the wire are selected according to the value of the electric current flowing in the channel layer 2. For example. when the minimum electric current value Imin is to be supplied, one of the source electrodes 3A, 3B, 3C, 3D and 3E and a drain electrode corresponding to one of the source electrodes 3A, 3B, 3C, 3D and 3E (=one of the drain electrodes 4A, 4B, 4C, 4D and 4E) are selected. When the maximum electric current value Imax is to be supplied, all the source electrodes 3A, 3B, 3C, 3D and 3E and all the drain electrodes 4A, 4B, 4C, 4D and 4E are selected. Further, when an electric current value between the electric current values Imin and Imax is to be supplied, two to four of the source electrodes 3A, 3B, 3C, 3D and 3E and two to four of the drain electrodes corresponding to the selected source electrodes are selected according to the electric current value.

Each of the carbon nanowall thin films 21 to 25 has the same quality as one another, and it is considered that the density of the electrons or holes induced in the carbon nanowall thin films 21 to 25 by the gate voltage applied to the gate electrode 6 is the same as one another, and therefore, each value of the electric current flowing between the source electrode 3 and the drain electrode 4 through a single carbon nanowall thin film (=each of the carbon nanowall thin films 21 to 25) is the same.

Accordingly, when a single gate electrode 6 is formed with respect to all the five source electrodes 3A, 3B, 3C, 3D and 3E and the five drain electrodes 4A, 4B, 4C, 4D and 4E, the value of the electric current flowing in the channel layer 2 can be controlled in a stepwise manner.

In the thin film transistor 10-1, the gate electrode 6 may be formed of five gate electrodes corresponding to the carbon nanowall thin films 21 to 25. In this case, the five gate electrodes are formed respectively at the positions opposite to the five carbon nanowall thin films 21 to 25. Thereby, the value of the electric current flowing in each of the carbon nanowall thin films 21 to 25 can be controlled independently by the gate voltage applied to the gate electrodes.

To produce the thin film transistor having five gate electrodes, a process to divide the gate electrode 6 into five gate electrodes by etching may be added after forming the gate electrode 6, or a process to form five gate electrodes by using a mask may be adopted instead of a process to form the gate electrode 6 on the entire back surface of the silicon substrate 1 (or the silicon substrate 1A) in the process charts shown in FIGS. 7 and 8, the process charts shown in FIGS. 11 to 13 or the process charts shown in FIGS. 14 and 15 previously mentioned.

Other descriptions about the thin film transistor 10-1 are the same as the descriptions of the thin film transistor 10.

In the thin film transistors 10 and 10-1, the height of the carbon nanowall thin films 21 to 25 becomes the channel width. Accordingly, in the thin film transistors 10 and 10-1, the channel width can be controlled by controlling the height of the carbon nanowall thin films 21 to 25.

Though it is described above that the thin film transistors 10 and 10-1 have five carbon nanowall thin films 21 to 25, the first embodiment is not limited thereto, and the thin film transistors 10 and 10-1 may generally have two or more carbon nanowall thin films. When the thin film transistor 10-1 has two or more carbon nanowall thin films, the number of the source electrodes and the number of the drain electrodes of the thin film transistor 10-1 may be the same as the number of carbon nanowall thin films, or the number of the source electrodes, the number of the drain electrodes, and the number of the gate electrodes may be the same as the number of carbon nanowall thin films.

The silicon substrates 1 and 1A may have a concave-convex shape in grid-like configurations on one main surface, and generally, may have a concave-convex shape in stripe-like or grid-like configuration on one main surface. It is because a plurality of carbon nanowall thin films can be formed in parallel on the silicon substrate even if a concave-convex shape is formed in grid-like configurations.

Second Embodiment

Figure 22:
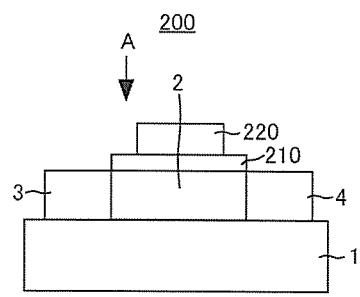
FIG. 22 is a cross-sectional view illustrating the structure of a thin film transistor in the second embodiment.
Figure 23:
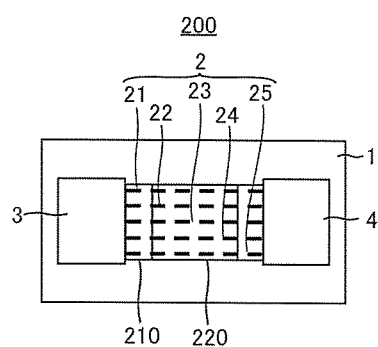
FIG. 23 is a plan view of the thin film transistor when viewed from the A direction shown in FIG. 22.

FIG. 22 is a cross-sectional view illustrating the structure of a thin film transistor in the second embodiment. FIG. 23 is a plan view of the thin film transistor when viewed from the A direction shown in FIG. 22.

Referring to FIGS. 22 and 23, a thin film transistor 200 of the second embodiment is the same as the thin film transistor 10 except that the insulating film 5 of the thin film transistor 10 shown in FIGS. 1 and 2 is replaced with an insulating film 210, and the gate electrode 6 is replaced with a gate electrode 220.

The insulating film 210 is generally composed of a derivative and is disposed on the upper side of the carbon nanowall thin films 21 to 25 to be in contact with the carbon nanowall thin films 21 to 25. The derivative is composed of, for example, silicon oxide, barium titanate, ion liquid, etc.

The gate electrode 220 is composed of the same material as the abovementioned gate electrode 6, and is disposed on the insulating film 210 to be in contact with the insulating film 210.

As described above, the thin film transistor 200 is a top gate type thin film transistor in which the gate electrode 220 is disposed above the channel layer 2.

Figure 24:
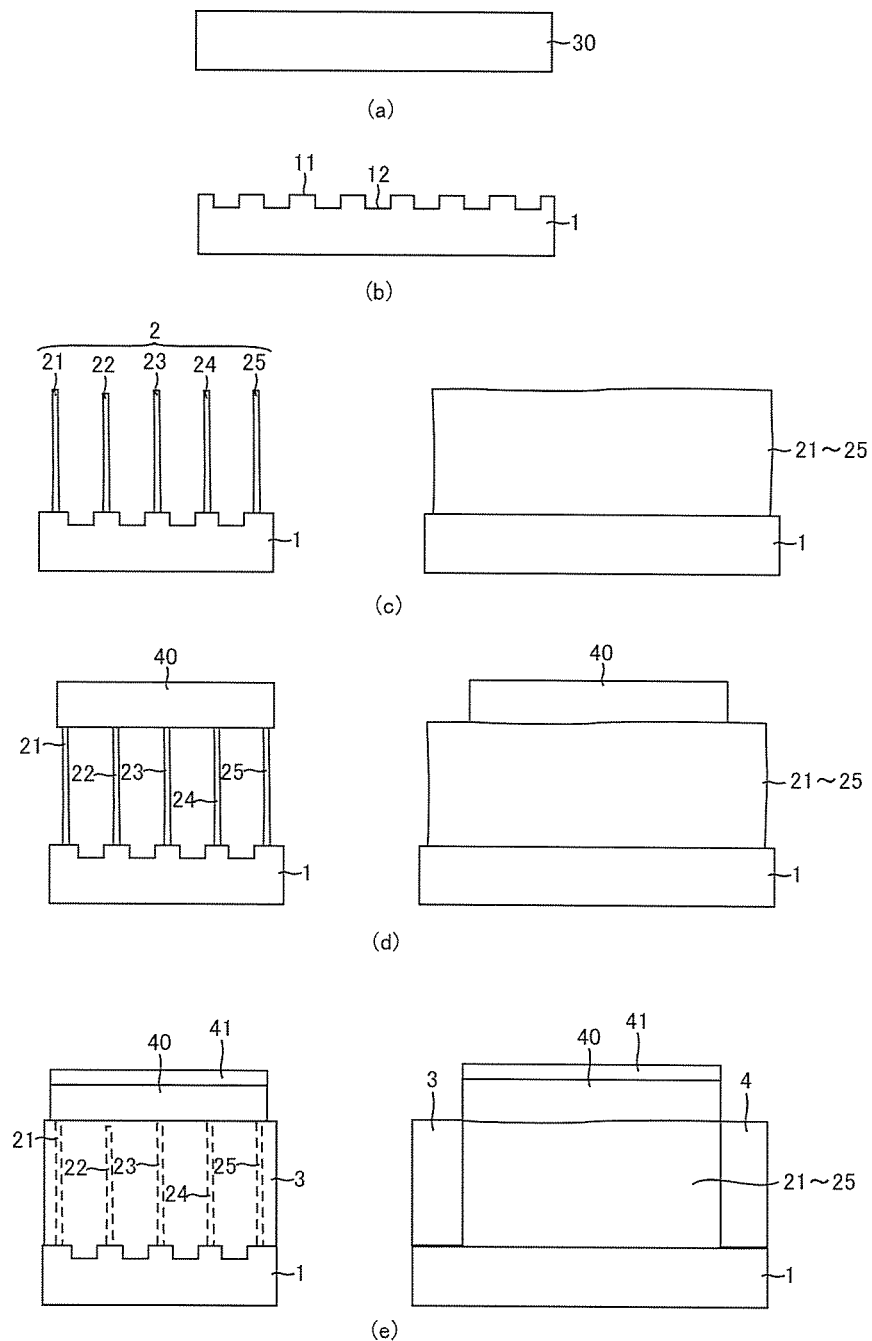
FIG. 24 is the first process chart illustrating a production method of the thin film transistor shown in FIGS. 22 and 23.
Figure 25:
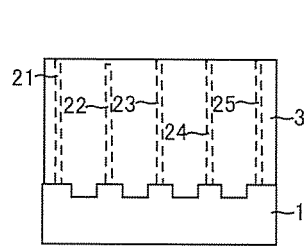
FIG. 25 is the second process chart illustrating a production method of the thin film transistor shown in FIGS. 22 and 23.
Figure 25:
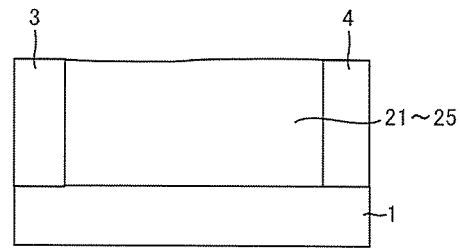
Figure 25:
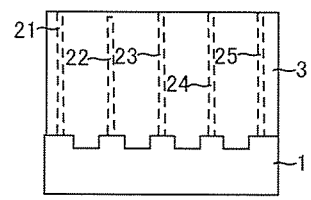
Figure 25:
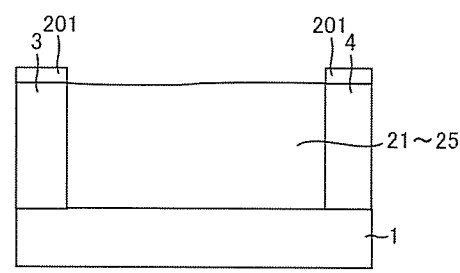
Figure 25:
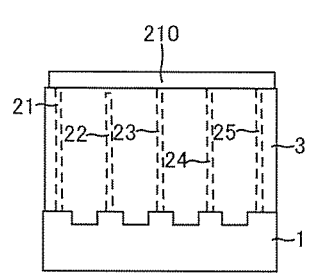
Figure 25:
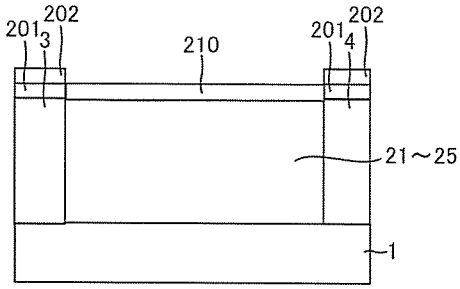
Figure 26:
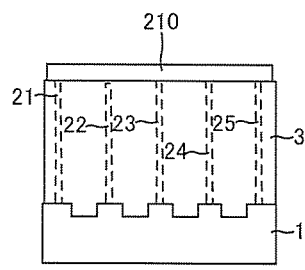
FIG. 26 is the third process chart illustrating a production method of the thin film transistor shown in FIGS. 22 and 23.
Figure 26:
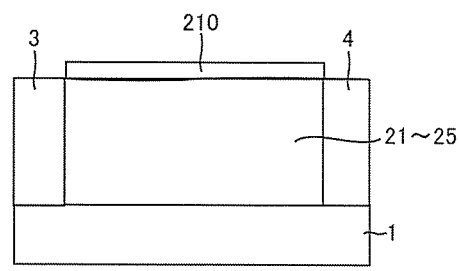
Figure 26:
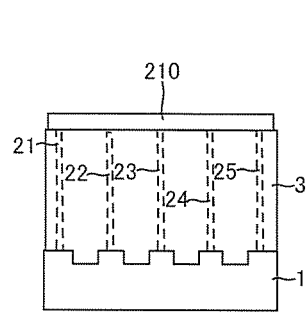
Figure 26:
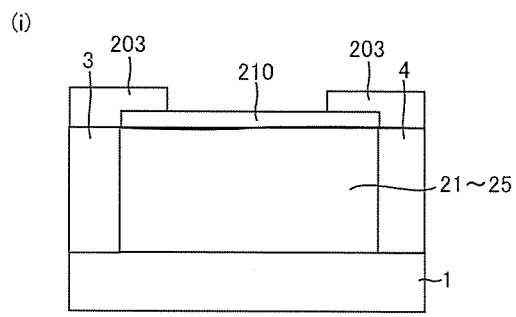
Figure 26:
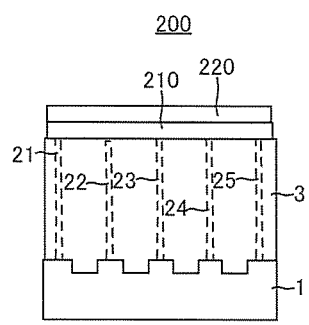
Figure 26:
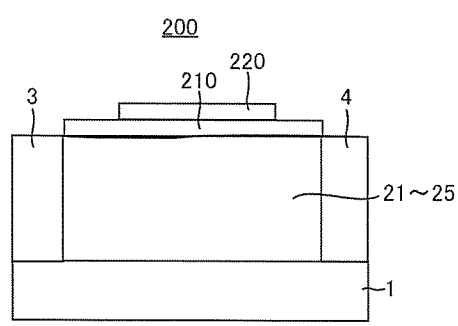

FIGS. 24 to 26 are respectively the first to the third process charts illustrating a production method of the thin film transistor 200 shown in FIGS. 22 and 23.

In Steps (c) to (k), a side view as seen from the length direction of the protruding portion 11 and a side view as seen from the direction perpendicular to the length direction of the protruding portion 11 are shown. In Steps (e) to (k), the carbon nanowall thin films 21 to 25 covered by the source electrode 3 are shown by broken lines.

Referring to FIG. 24, when the production of the thin film transistor 200 begins, the same process as Step (a) shown in FIG. 7 is performed (refer to Step (a)).

Then, the silicon substrate 1 is formed by performing the same process as Step (c) shown in FIG. 7 (refer to Step (b)).

After that, the same processes as Steps (d) and (e) shown in FIG. 7 and Steps (f) and (g) shown in FIG. 8 are sequentially performed (refer to Steps (c) to (e) shown in FIG. 24 and Step (f) shown in FIG. 25).

Referring to FIG. 25, after Step (f), a resist is applied on the source electrode 3, the drain electrode 4 and the carbon nanowall thin films 21 to 25, and a resist pattern 201 is formed by patterning the applied resist by photo lithography and etching (refer to Step (g)).

Then, the insulating film 210 is formed on the carbon nanowall thin films 21 to 25 by using the resist pattern 201 as a mask (refer to Step (h)). In this case, insulating films 202 are formed on the resist pattern 201.

Referring to FIG. 26, after Step (h), the resist pattern 201 is removed (refer to Step (i)). Thereby, the insulating films 202 are removed by lift-off.

Then, a resist is applied on the source electrode 3, the drain electrode 4 and the insulating film 210, and the resist pattern 203 is formed by patterning the applied resist by photo lithography and etching (refer to Step (j)).

After that, Ti and Au are successively laminated on the insulating film 210 by electronic beam evaporation, and the resist pattern 203 is removed. Thereby, the gate electrode 220 is formed on the insulating film 210, and the production of the thin film transistor 200 is completed (refer to Step (k)).

FIGS. 27 to 30 are respectively the first to the fourth process charts illustrating another production method of the thin film transistor 200 shown in FIGS. 22 and 23.

In Steps (c) to (n), a side view as seen from the length direction of the protruding portion 11 and a side view as seen from the direction perpendicular to the length direction of the protruding portion 11 are shown. In Steps (h) to (n), the carbon nanowall thin films 21 to 25 covered by the source electrode 3 are shown by broken lines.

Figure 27:
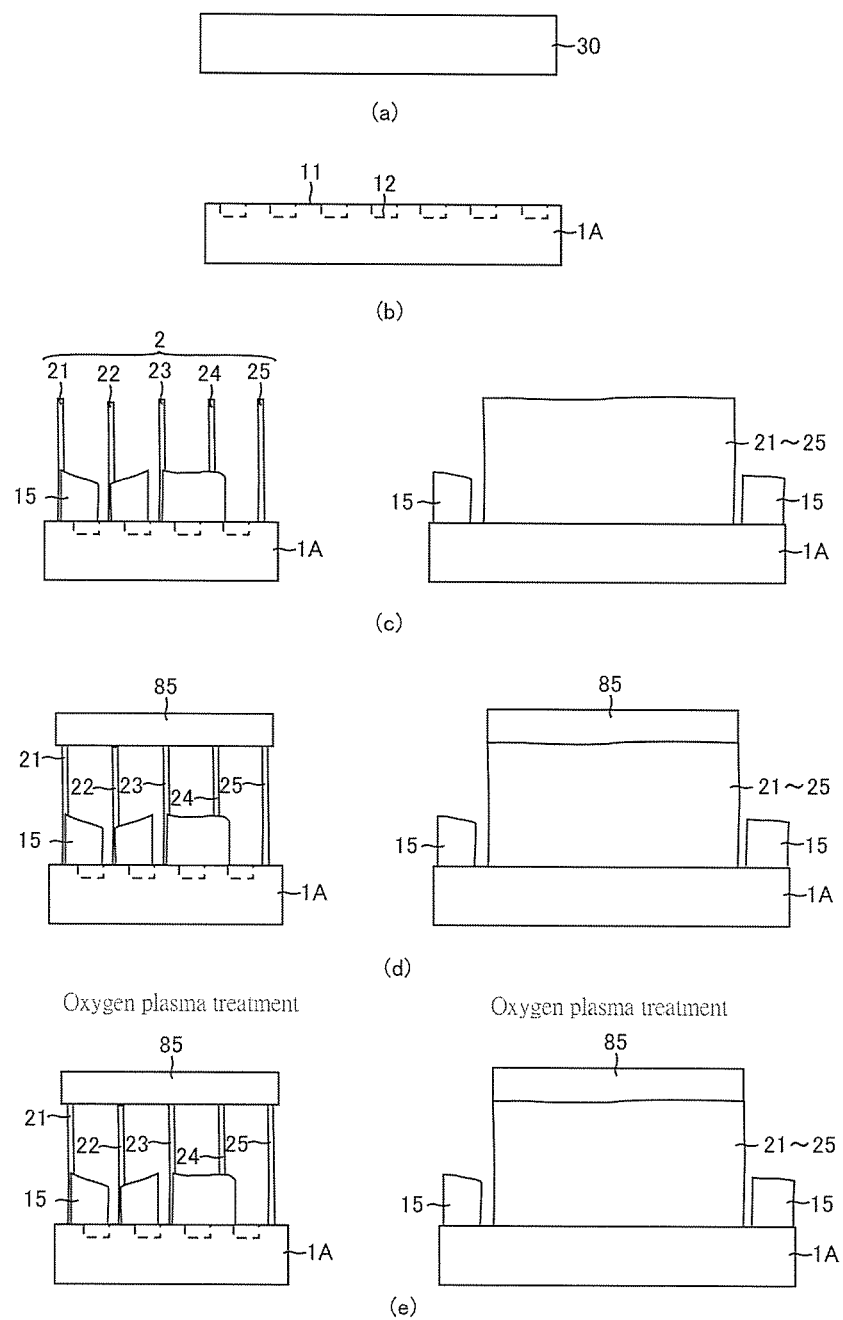
FIG. 27 is the first process chart illustrating another production method of the thin film transistor shown in FIGS. 22 and 23.

Referring to FIG. 27, when the production of the thin film transistor 200 begins, the same process as Step (a) shown in FIG. 1 is performed (refer to Step (a)).

Then, the same processes as Steps (c) and (d) shown in FIG. 11 are sequentially performed (refer to Steps (b) to (c) shown in FIG. 27).

After Step (c), a resist is applied so as to cover the region 13, and the resist pattern 85 is formed by patterning the applied resist by photo lithography (refer to Step (d)).

Then, the gas introducing part 28 supplies 60 sccm of $O_2$ gas to the inside of the vacuum container 20. Then, the pressure inside the vacuum container 20 is adjusted to 4.5 Pa.

After that, the high-frequency power source 62 applies 100 W high-frequency power having a frequency of 13.56 MHz to the plane conductor 50 via the matching circuit 64 and the connection conductor 68.

Thereby, the plasma 70 is generated inside the vacuum container 20, and the region 14 of the silicon substrate 1A is processed using the resist pattern 84 as a mask by oxygen plasma (refer to Step (e)). In this case, the processing time of oxygen plasma is, for example, 3 minutes. Thereby, the carbon nanowall thin films 15 are removed. After the oxygen plasma process is completed, the resist pattern 85 is removed by using 1-methyl-2-pyrrolidone (refer to Step (f) of FIG. 28).

Then, a resist is applied on the carbon nanowall thin films 21 to 25 except the both end portions in the length direction of the protruding portion 11, and a resist pattern 86 is formed by patterning the applied resist by photo lithography (refer to Step (g)).

Next, Ti and Au are successively laminated on the carbon nanowall thin films 21 to 25 and the resist pattern 86 by electronic beam evaporation. Thereby, the source electrode 3 and the drain electrode 4 are formed (refer to Step (h)). In this case, a metal layer 87 is formed on the resist pattern 86.

After that, the resist pattern 86 is removed by using 1-methyl-2-pyrrolidone (refer to Step (i)). Thereby, the metal layer 87 is removed by lift-off.

Figure 29:
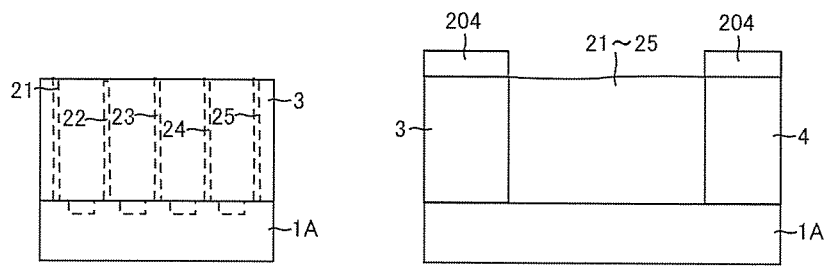
FIG. 29 is the third process chart illustrating another production method of the thin film transistor shown in FIGS. 22 and 23.
Figure 29:
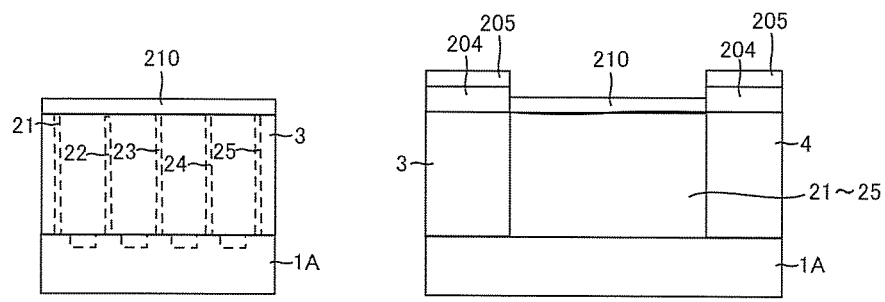
Figure 29:
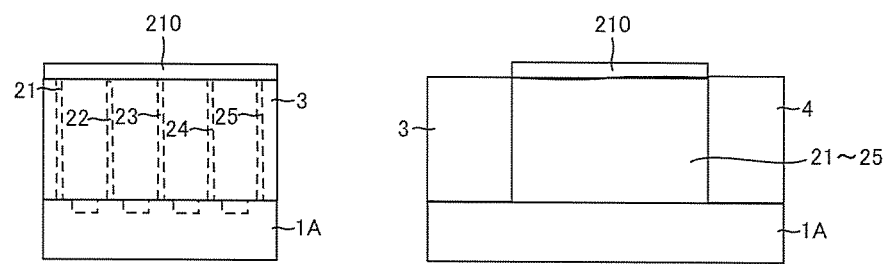

Referring to FIG. 29, after Step (i), a resist is applied on the source electrode 3, the drain electrode 4 and the carbon nanowall thin films 21 to 25, and a resist pattern 204 is formed by patterning the applied resist by photo lithography and etching (refer to Step (j)).

Then, the insulating film 210 is formed on the carbon nanowall thin films 21 to 25 by using the resist pattern 204 as a mask (refer to Step (k)). In this case, insulating films 205 are formed on the resist pattern 204.

After that, the resist pattern 204 is removed (refer to Step (l)). Thereby, the insulating films 205 are removed by lift-off.

Figure 30:
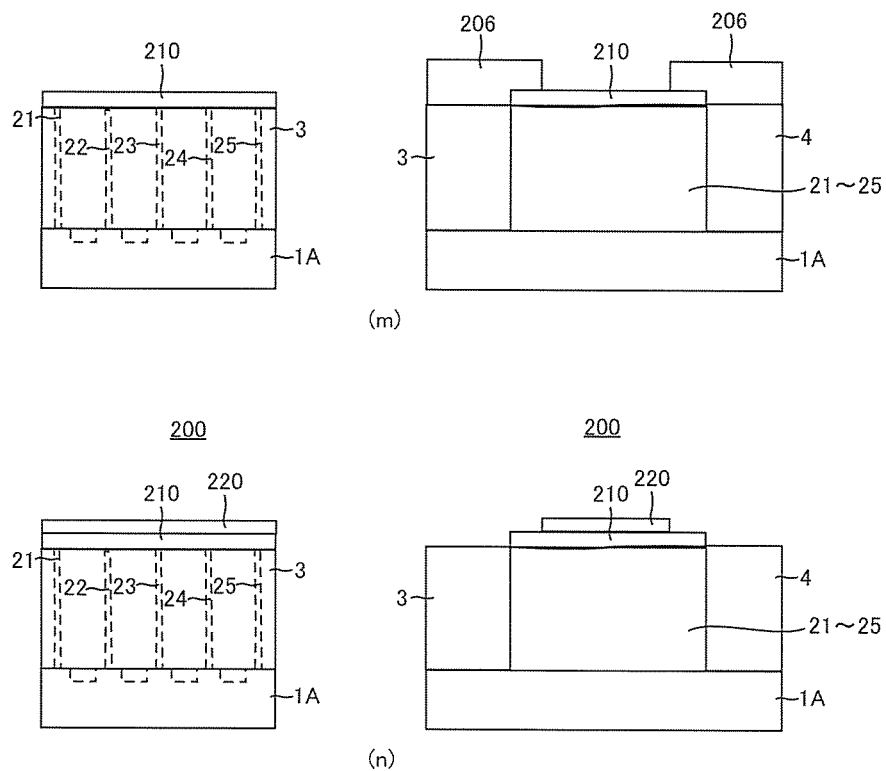
FIG. 30 is the fourth process chart illustrating another production method of the thin film transistor shown in FIGS. 22 and 23.

Referring to FIG. 30, after Step (l), a resist is applied on the source electrode 3, the drain electrode 4 and the insulating film 210, and a resist pattern 206 is formed by patterning the applied resist by photo lithography and etching (refer to Step (m)).

After that, Ti and Au are successively laminated on the insulating film 210 by electronic beam evaporation, and the resist pattern 206 is removed. Thereby, a gate electrode 220 is formed on the insulating film 210, and the production of the thin film transistor 200 is completed (refer to Step (n)).

As described above, in the second embodiment, the thin film transistor 200 is also produced by removing the carbon nanowall thin film 15 formed in the region 14 by oxygen plasma. As a result, the leakage current in the top gate type thin film transistor 200 can be significantly reduced.

Though the process charts shown in FIGS. 27 to 30 are the process charts in which the thin film transistor 200 is produced by forming the source electrode 3, the drain electrode 4 and the gate electrode 220 after removing the carbon nanowall thin films 15 formed on the region 14 by oxygen plasma, the second embodiment is not limited thereto. In the second embodiment, the thin film transistor 200 may be produced by removing the carbon nanowall thin films 15 formed on the region 14 by oxygen plasma after the source electrode 3, the drain electrode 4 and the gate electrode 220 are formed.

Figure 31:
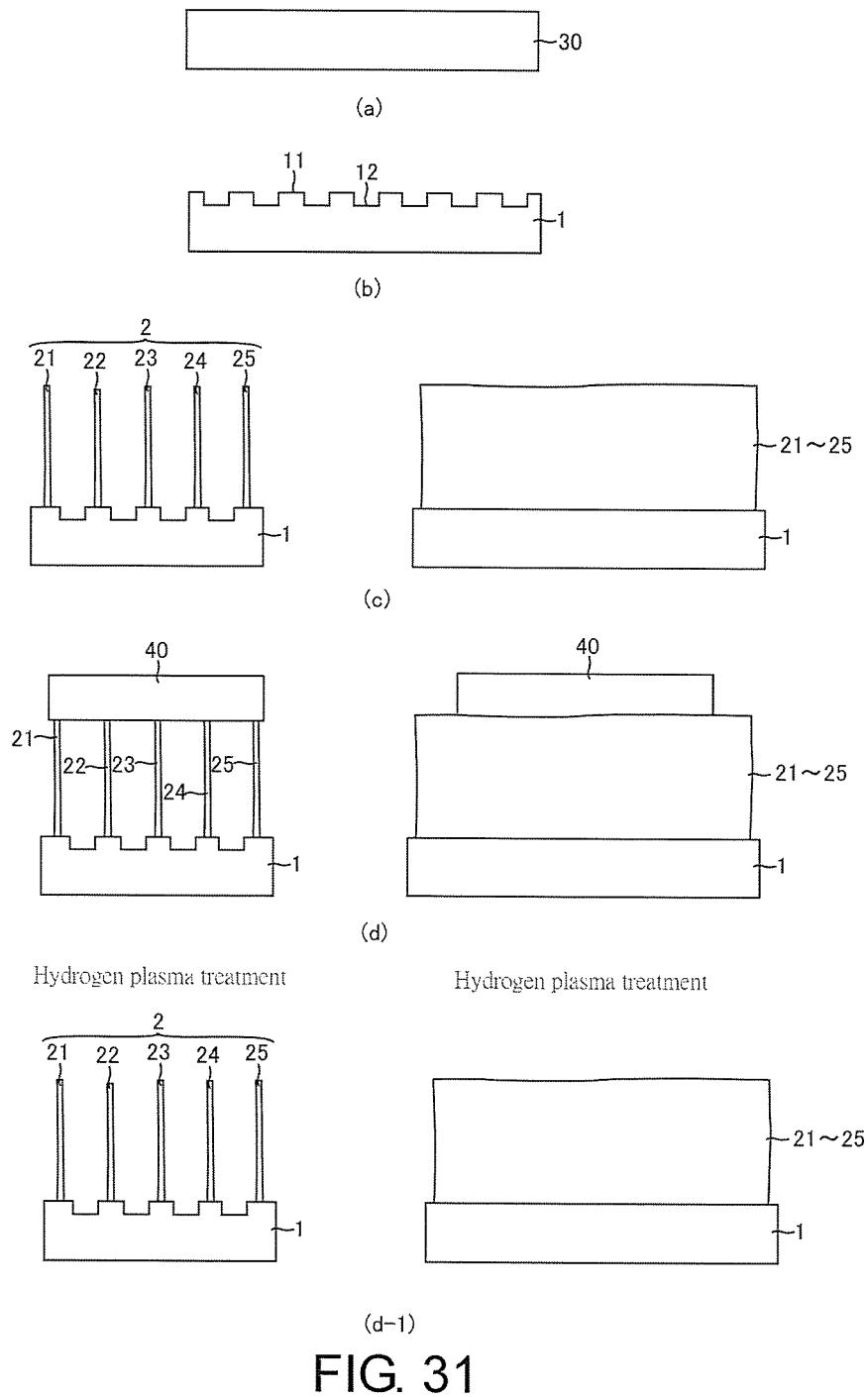
FIG. 31 is the first process chart illustrating yet another production method of the thin film transistor shown in FIGS. 22 and 23.
Figure 32:
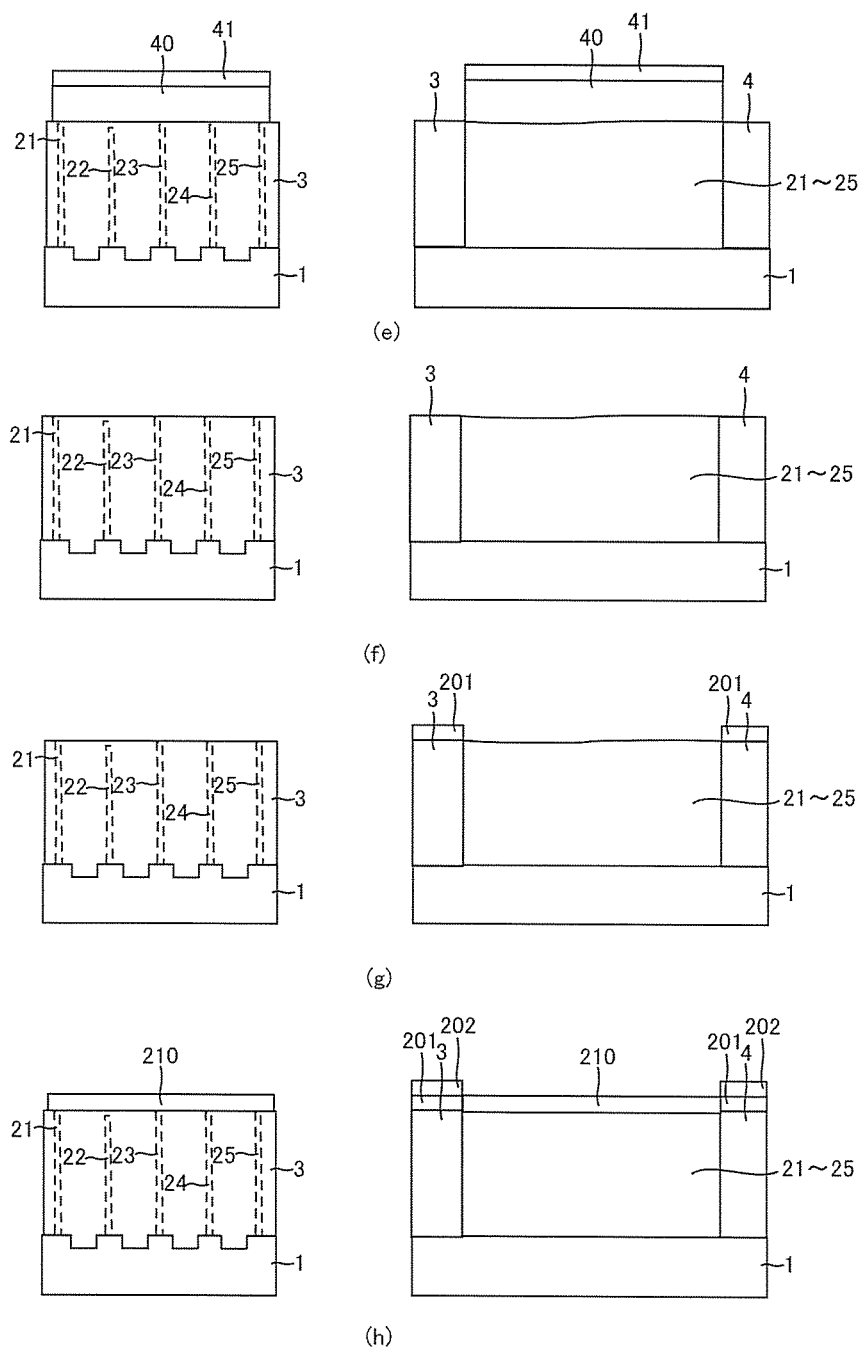
FIG. 32 is the second process chart illustrating yet another production method of the thin film transistor shown in FIGS. 22 and 23.
Figure 33:
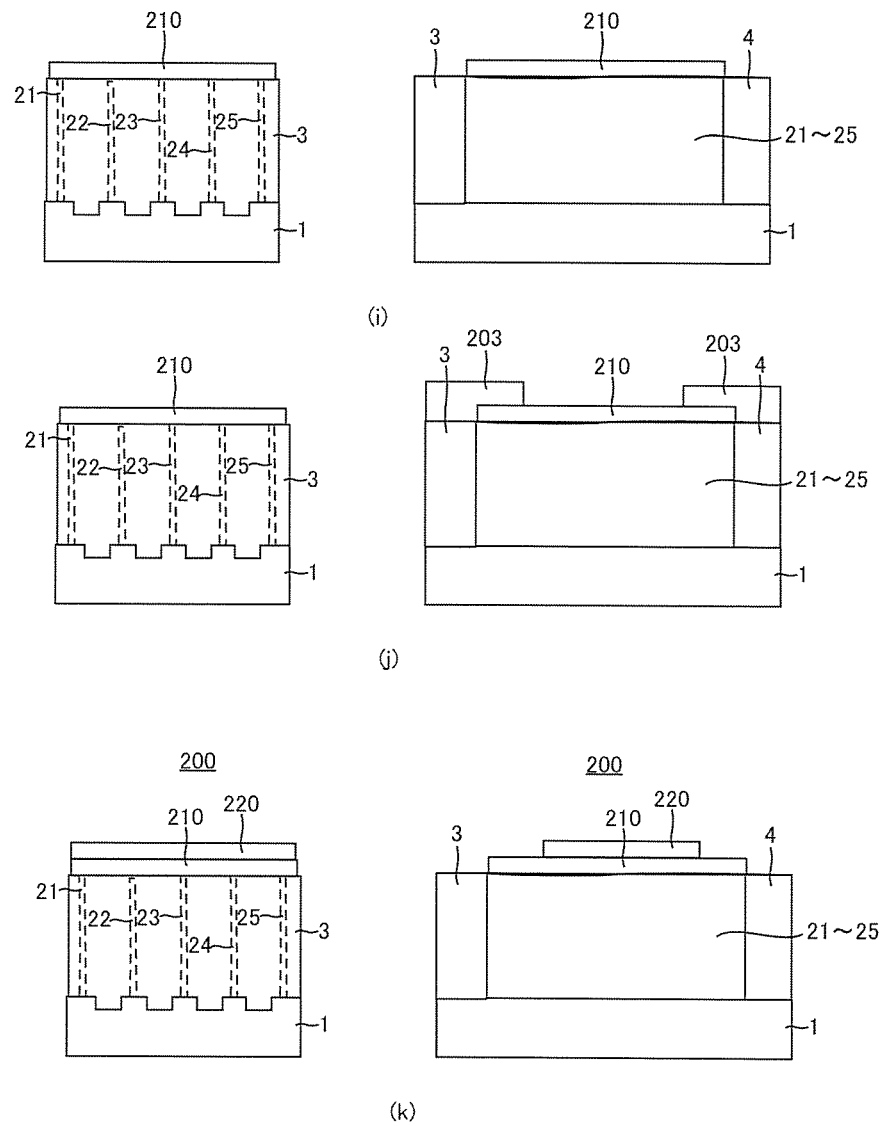
FIG. 33 is the third process chart illustrating yet another production method of the thin film transistor shown in FIGS. 22 and 23.

FIGS. 31 to 33 are respectively the first to the third process charts illustrating yet another production method of the thin film transistor 200 shown in FIGS. 22 and 23.

In Steps (c) to (k), a side view as seen from the length direction of the protruding portion 11 and a side view as seen from the direction perpendicular to the length direction of the protruding portion 11 are shown. In Steps (e) to (k), the carbon nanowall thin films 21 to 25 covered by the source electrode 3 are shown by broken lines.

The process charts shown in FIGS. 31 to 33 are the same as the process charts shown in FIGS. 24 to 26 except that Step (d-1) is added between Step (d) and Step (e).

Referring to FIG. 31, when the production of the thin film transistor 200 begins, the same processes as Steps (a) to (d) described in FIG. 24 are sequentially performed (refer to Steps (a) to (d)).

Then, after Step (d), the same process as Step (d-1) shown in FIG. 14 is performed (refer to Step (d-1)).

After that, the same processes as Step (e) shown in FIG. 24, Steps (f) to (h) shown in FIG. 25 and Steps (i) to (k) shown in FIG. 26 are sequentially performed, and the production of the thin film transistor 200 is completed (refer to Steps (e) to (h) shown in FIG. 32 and Steps (i) to (k) shown in FIG. 33).

As describe above, in the second embodiment, the thin film transistor 200 is also produced by forming the source electrode 3 and the drain electrode 4 after processing the surfaces of the carbon nanowall thin films 21 to 25 by hydrogen plasma. As a result, the adhesion of the source electrode 3 and the drain electrode 4 in the thin film transistor 200 can be enhanced.

As mentioned above, the thin film transistor 200 of the second embodiment may be produced according to any one of the following process charts: the process charts without using oxygen plasma processing and hydrogen plasma processing (the process charts shown in FIGS. 24 to 26); the process charts using oxygen plasma processing (the process charts shown in FIGS. 27 to 30); and the process charts using hydrogen plasma processing (the process charts shown in FIGS. 31 to 33).

In the second embodiment, the thin film transistor 200 may be produced by adding Step (d-1) of FIG. 31 between Step (f) and Step (g) of the process charts shown in FIGS. 27 to 30. Thereby, the leakage current can be significantly reduced and the adhesion of the source electrode 3 and the drain electrode 4 can be enhanced in the top gate type thin film transistor 200.

Figure 34:
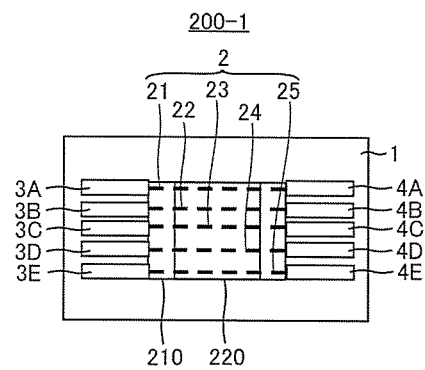
FIG. 34 is a plan view illustrating the structure of another thin film transistor of the second embodiment.

FIG. 34 is a plan view illustrating the structure of another thin film transistor of the second embodiment. The thin film transistor of the second embodiment may be the thin film transistor 200-1 shown in FIG. 34.

Referring to FIG. 34, the thin film transistor 200-1 is the same as the thin film transistor 200 except that the source electrode 3 is replaced with source electrodes 3A to 3E, and the drain electrode 4 is replaced with drain electrodes 4A to 4E.

The source electrodes 3A to 3E and the drain electrodes 4A to 4E are as previously described.

In the thin film transistor 200-1, the insulating film 210 and the gate electrode 220 are disposed on the channel layer 2 (=the carbon nanowall thin films 21 to 25).

Accordingly, the thin film transistor 200-1 is formed of a structure in which five thin film transistors are disposed in parallel in the in-plane direction of the silicon substrate 1 to be the same as the thin film transistor 10-1 (refer to FIG. 21).

The thin film transistor 200-1 is produced according to the process charts shown in FIGS. 24 to 26 with an additional process between Step (f) and Step (g) to form the source electrodes 3A, 3B, 3C, 3D and 3E and the drain electrodes 4A, 4B, 4C, 4D and 4E by etching a portion of the source electrode 3 and the drain electrode 4.

The thin film transistor 200-1 may also be produced according to the process charts shown in FIGS. 27 to 30 with an additional process between Step (i) and Step (j) to form the source electrodes 3A, 3B, 3C, 3D and 3E and the drain electrodes 4A, 4B, 4C, 4D and 4E by etching a portion of the source electrode 3 and the drain electrode 4.

Further, the thin film transistor 200-1 may be produced according to the process charts shown in FIGS. 31 to 33 with an additional process between Step (f) and Step (g) to form the source electrodes 3A, 3B, 3C, 3D and 3E and the drain electrodes 4A, 4B, 4C, 4D and 4E by etching a portion of the source electrode 3 and the drain electrode 4.

Since the only difference between the thin film transistor 200-1 and the thin film transistor 10-1 is that the insulating film 210 and the gate electrode 220 are disposed on the upper side of the channel layer 2, the thin film transistor 200-1 can benefit from the same effect as the thin film transistor 10-1.

Other descriptions regarding the thin film transistor 200-1 are the same as the descriptions of the thin film transistor 10-1.

Other descriptions regarding the second embodiment are the same as the descriptions in the first embodiment.

Third Embodiment

Figure 35:
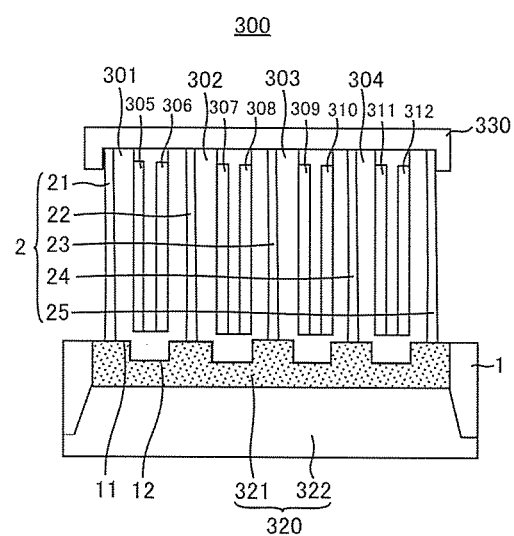
FIG. 35 is a cross-sectional view illustrating the structure of a thin film transistor of the third embodiment.

FIG. 35 is a cross-sectional view illustrating the structure of a thin film transistor of the third embodiment. Referring to FIG. 35, a thin film transistor 300 of the third embodiment includes the silicon substrate 1, the channel layer 2, insulating films 301 to 304, gate electrodes 305 to 312, a source electrode 320 and a drain electrode 330.

The silicon substrate 1 and the channel layer 2 are as previously described.

The source electrode 320 is disposed on one main surface side of the silicon substrate 1. The source electrode 320 includes an impurity region 321 and a metal region 322.

The impurity region 321 contacts the protruding portions 11 and the recessed portions 12 of the silicon substrate 1, and is disposed in the silicon substrate 1. The impurity region 321 has a conduction type the same as or opposite to the conduction type of the silicon substrate 1, and has an impurity concentration of approximately $10^{20}$ cm$^{-3}$. More specifically, the impurity region 321 has a phosphorous (P) concentration or a boron (B) concentration of approximately $10^{20}$ cm$^{-3}$ regardless of the conduction type of the silicon substrate 1.

The metal region 322 is disposed to be in contact with the silicon substrate 1 and the impurity region 321. The metal region 322 is constructed by successively laminating Ti and Au.

As a result of the impurity region 321 being disposed in the silicon substrate 1 to be in contact with the protruding portions 11 and the recessed portions 12 of the silicon substrate 1, one end of the carbon nanowall thin films 21 to 25 is connected to the source electrode 320.

The insulating films 301 to 304 are disposed respectively between the carbon nanowall thin films 21 and 22, between the carbon nanowall thin films 22 and 23, between the carbon nanowall thin films 23 and 24 and between the carbon nanowall thin films 24 and 25, and have a cross section of an approximate U-shape. Each of the insulating films 301 to 304 is made of SiO$_2$, for example.

Then, the insulating film 301 contacts the carbon nanowall thin films 21 and 22 and the source electrode 320. The insulating film 302 contacts the carbon nanowall thin films 22 and 23 and the source electrode 320. The insulating film 303 contacts the carbon nanowall thin films 23 and 24 and the source electrode 320. The insulating film 304 contacts the carbon nanowall thin films 24 and 25 and the source electrode 320.

The gate electrode 305 is disposed to face the carbon nanowall thin film 21 as well as contact the insulating film 301. The gate electrode 306 is disposed to face the surface of one side of the carbon nanowall thin film 22 as well as contact the insulating film 301.

The gate electrode 307 is disposed to face the surface of the other side of the carbon nanowall thin film 22 as well as contact the insulating film 302. The gate electrode 308 is disposed to face the surface of one side of the carbon nanowall thin film 23 as well as contact the insulating film 302.

The gate electrode 309 is disposed to face the surface of the other side of the carbon nanowall thin film 23 as well as contact the insulating film 303. The gate electrode 310 is disposed to face the surface of one side of the carbon nanowall thin film 24 as well as contact the insulating film 303.

The gate electrode 311 is disposed to face the surface of the other side of the carbon nanowall thin film 24 as well as contact the insulating film 304. The gate electrode 312 is disposed to face the surface of one side of the carbon nanowall thin film 25 as well as contact the insulating film 304.

The drain electrode 330 is disposed to be in contact with the carbon nanowall thin films 21 to 25 and the insulating films 301 to 304. More specifically, the drain electrode 330 is disposed to be in contact with a side surface in parallel to the thickness direction of the carbon nanowall thin films 21 to 25 and a side surface in parallel to the thickness direction of the insulating films 301 to 304 on the opposite side to the silicon substrate 1 side.

Each of the gate electrodes 305 to 312 and the drain electrode 330 is constructed by successively laminating Ti and Au.

In the thin film transistor 300, when desired voltage is applied to the gate electrodes 305, 307, 309, 311 and 312 and the desired voltage is applied between the source electrode 320 and the drain electrode 330, and electric current flows through the carbon nanowall thin films 21 to 25 toward the normal direction of the silicon substrate 1. Then, the electric current flowing in the carbon nanowall thin films 21 to 25 is controlled by the voltage applied to the gate electrodes 305, 307, 309, 311 and 312.

When electric current passes through the carbon nanowall thin films 22 to 24, desired voltage may be applied to the gate electrodes 306, 308 and 310 instead of the gate electrodes 307, 309 and 311, or desired voltage may be applied to the gate electrodes 306 and 307, 308 and 309, and 310 and 311.

As described above, the thin film transistor 300 is a vertical type thin film transistor in which electric current flows in the channel layer 2 (the carbon nanowall thin films 21 to 25) toward the normal direction of the silicon substrate 1. The channel layer 2 has a structure in which five carbon nanowall thin films 21 to 25 are disposed in parallel between the source electrode 320 and the drain electrode 330 in the normal direction of the silicon substrate 1. As a result, electric current flows in parallel between the source electrode 320 and the drain electrode 330.

Accordingly, it is possible to pass larger electric current through compared to the case that the channel layer is formed of a single carbon nanowall thin film. In addition, since the channel layer 2 is disposed in the normal direction of the silicon substrate 1, the degree of integration of the thin film transistor 300 can be increased compared to the case that the channel layer 2 is disposed in the in-plane direction. Further, the channel width is determined by the size of the carbon nanowall thin films 21 to 25 in the length direction of the protruding portion 11 (the direction perpendicular to the paper surface of FIG. 35), and the channel width can be controlled by the length of the protruding portions 11 since the carbon nanowall thin films 21 to 25 grow with orientation only on the protruding portions 11.

FIGS. 36 to 39 are respectively the first to the fourth process charts illustrating a production method of the thin film transistor 300 shown in FIG. 35.

Figure 36:
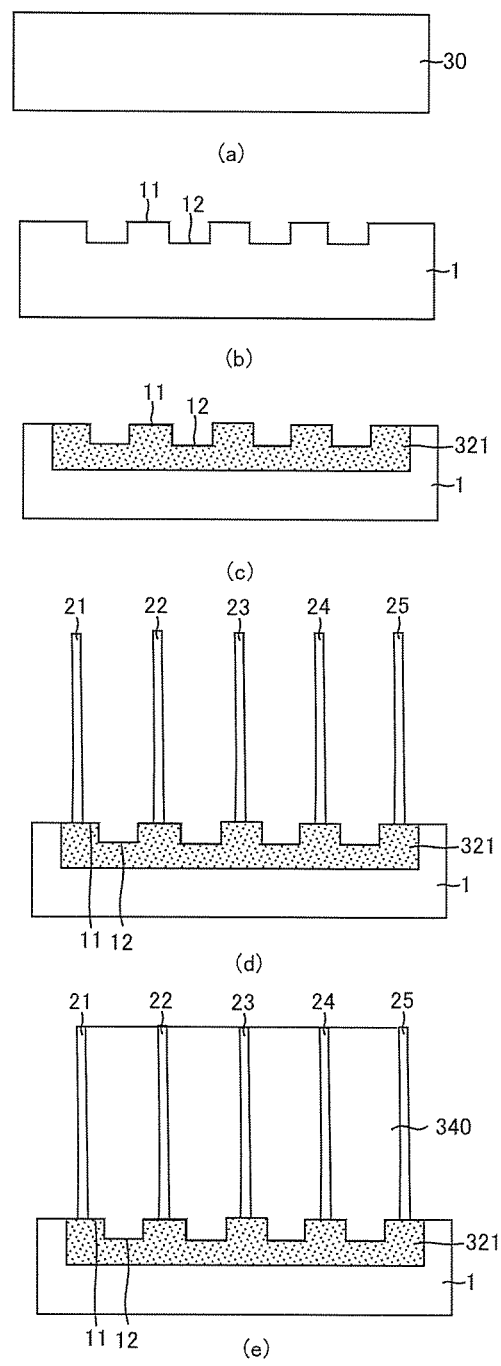
FIG. 36 is the first process chart illustrating a production method of the thin film transistor shown in FIG. 35.

Referring to FIG. 36, when the production of the thin film transistor 300 begins, the silicon substrate 1 is formed by sequentially performing the same processes as Steps (a) and (c) shown in FIG. 7 (refer to Steps (a) and (b)).

After Step (b), the impurity region 321 is formed by ion implantation of impurity atoms (P or B) to the one main surface side of the silicon substrate 1 on which the protruding portions 11 and the recessed portions 12 are formed (refer to Step (c)).

Then, the carbon nanowall thin films 21 to 25 are formed on the protruding portions 11 of the silicon substrate 1 by performing the same process as Step (d) shown in FIG. 7.

After that, an insulating film 340 composed of $SiO_2$ is formed on the silicon substrate 1 between the carbon nanowall thin films 21 to 25 (refer to Step (e)). In this case, the insulating film 340 is formed of, for example, silane ($SiH_4$) gas and $O_2$ gas as material gas and formed by a plasma CVD method.

Figure 37:
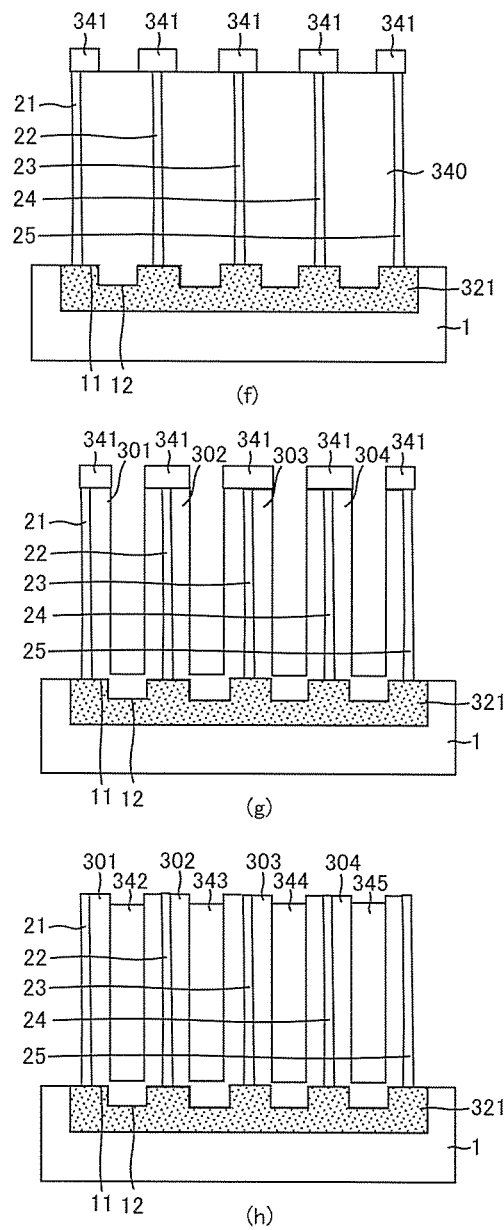
FIG. 37 is the second process chart illustrating a production method of the thin film transistor shown in FIG. 35.

Referring to FIG. 37, after Step (e), a resist is applied on the carbon nanowall thin films 21 to 25 and the insulating film 340, and a resist pattern 341 is formed by patterning the applied resist by photo lithography and etching (refer to Step (f)).

Then, the insulating films 301 to 304 are formed by etching the insulating film 340 using the resist pattern 341 as a mask (refer to Step (g)).

After that, metal layers 342 to 345 are formed by successively laminating Ti and Au to contact the insulating films 301 to 304 by electronic beam evaporation using the resist pattern 341 as a mask, and the resist pattern 341 is removed (refer to Step (h)). In this case, the metal layers deposited onto the resist pattern 341 are removed by lift-off.

Figure 38:
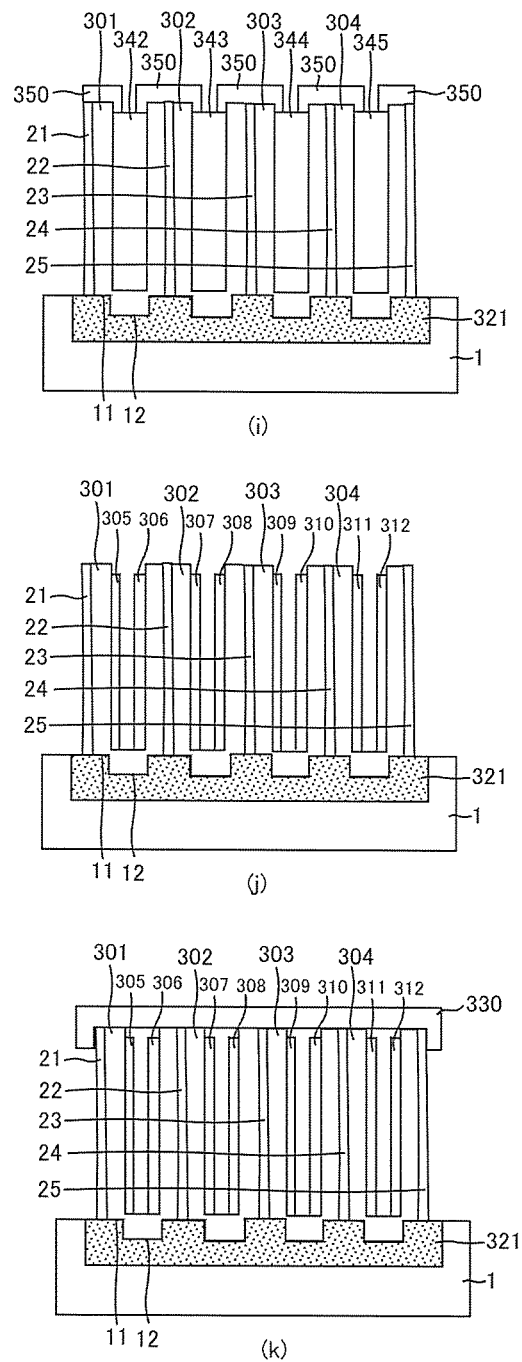
FIG. 38 is the third process chart illustrating a production method of the thin film transistor shown in FIG. 35.

Referring to FIG. 38, after Step (h), a resist is applied on the carbon nanowall thin films 21 to 25, the insulating films 301 to 304 and the metal layers 342 to 345, and a resist pattern 350 is formed by patterning the applied resist by photo lithography and etching (refer to Step (i)).

Then, the gate electrodes 305 to 312 are formed by etching the metal layers 342 to 345 using the resist pattern 350 as a mask, and then the resist pattern 350 is removed (refer to Step (j)). Thereby, the gate electrodes 305 to 312 are formed.

After that, the drain electrode 330 is formed by successively laminating Ti and Au on the carbon nanowall thin films 21 to 25 and the insulating films 301 to 304 by means of electronic beam evaporation (refer to Step (k)).

Figure 39:
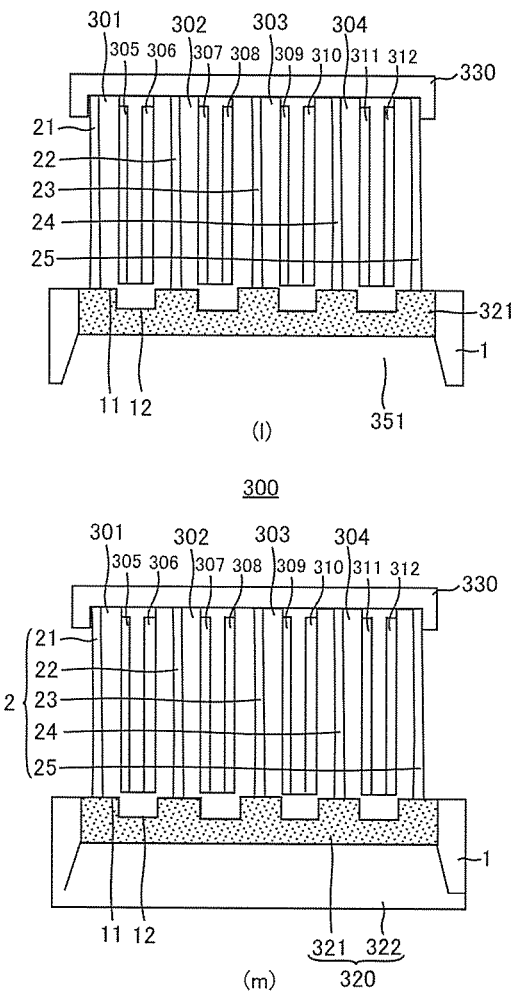
FIG. 39 is the fourth process chart illustrating a production method of the thin film transistor shown in FIG. 35.

Referring to FIG. 39, after Step (k), a recessed portion 351 reaching the impurity region 321 is formed by etching the back surface side of the silicon substrate 1 (refer to Step (l)).

Then, the metal region 322 is formed by successively laminating Ti and Au in the recessed portion 351 by electronic beam evaporation. Thereby, the source electrode 320 is formed, and the production of the thin film transistor 300 is completed (refer to Step (m)).

FIGS. 40 to 44 are respectively the first to the fifth process charts illustrating another production method of the thin film transistor 300 shown in FIG. 35.

Figure 40:
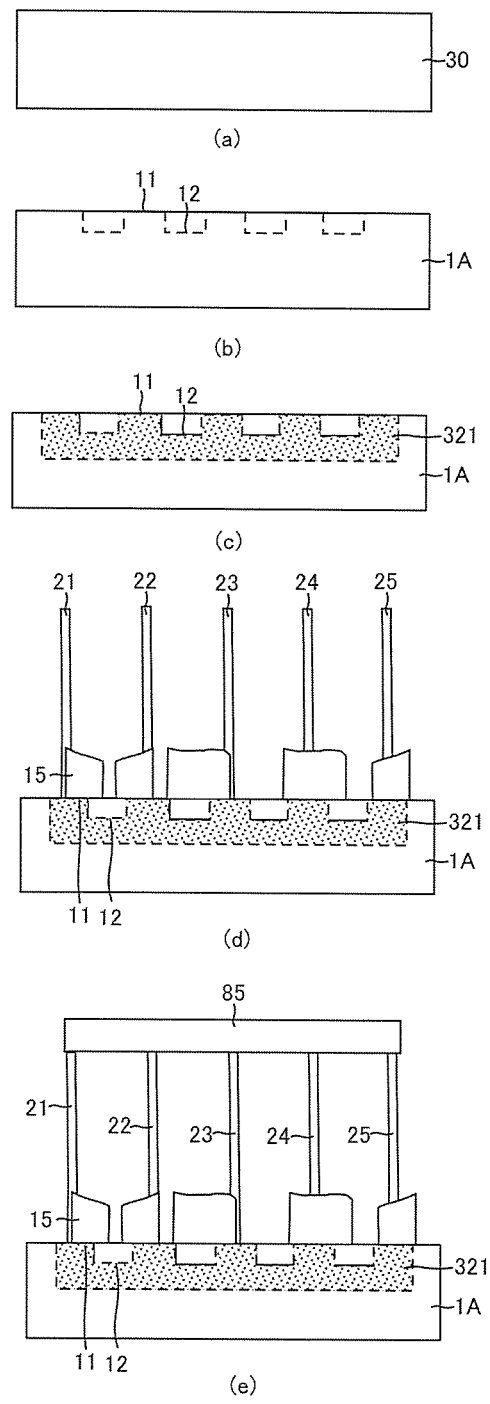
FIG. 40 is the first process chart illustrating another production method of the thin film transistor shown in FIG. 35.

Referring to FIG. 40, when the production of the thin film transistor 300 begins, the silicon substrate 1A is formed by sequentially performing the same processes as Steps (a) and (b) shown in FIG. 7 (refer to Steps (a) and (b)).

Then, after Step (b), the impurity region 321 is formed by ion implantation of impurity atoms (P or B) to the one main surface side of the silicon substrate 1A on which the protruding portions 11 and the recessed portions 12 are formed (refer to Step (c)).

Figure 28:
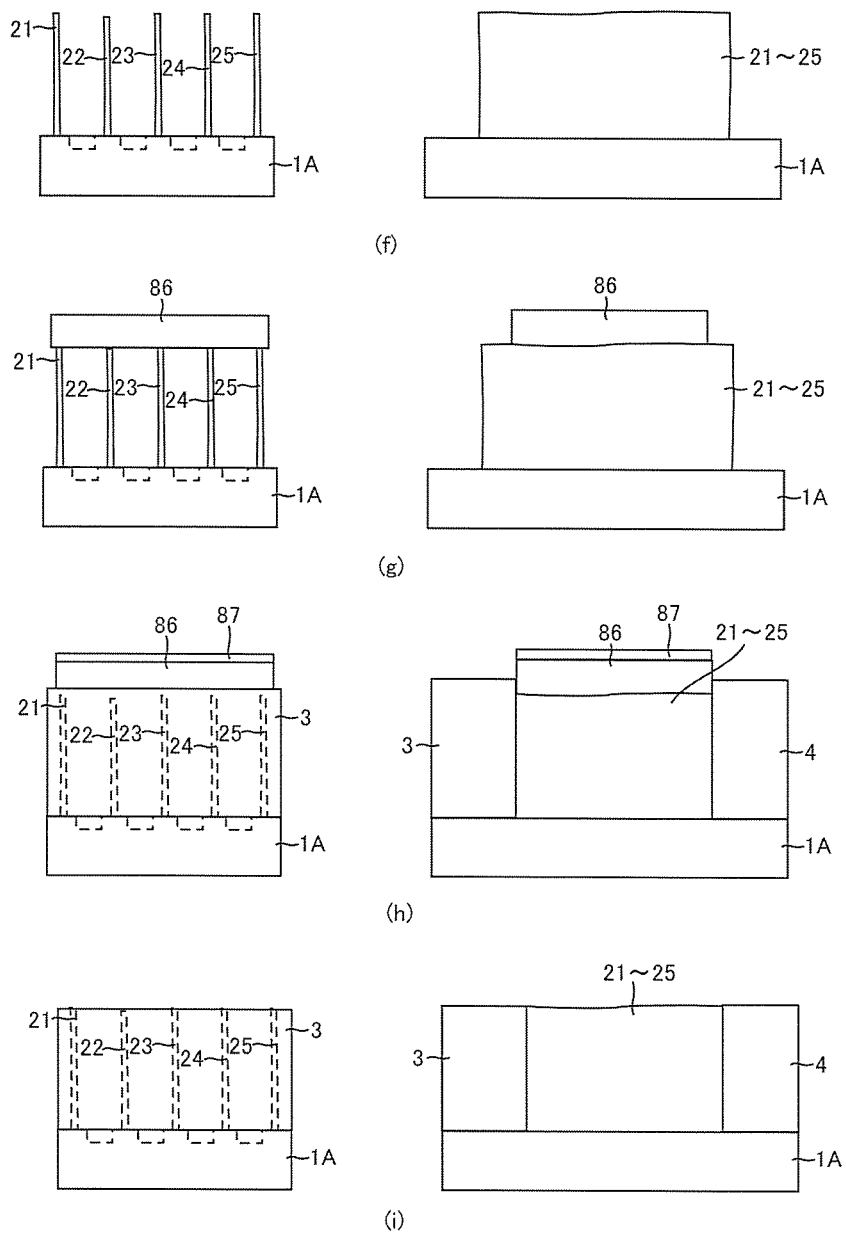
FIG. 28 is the second process chart illustrating another production method of the thin film transistor shown in FIGS. 22 and 23.
Figure 41:
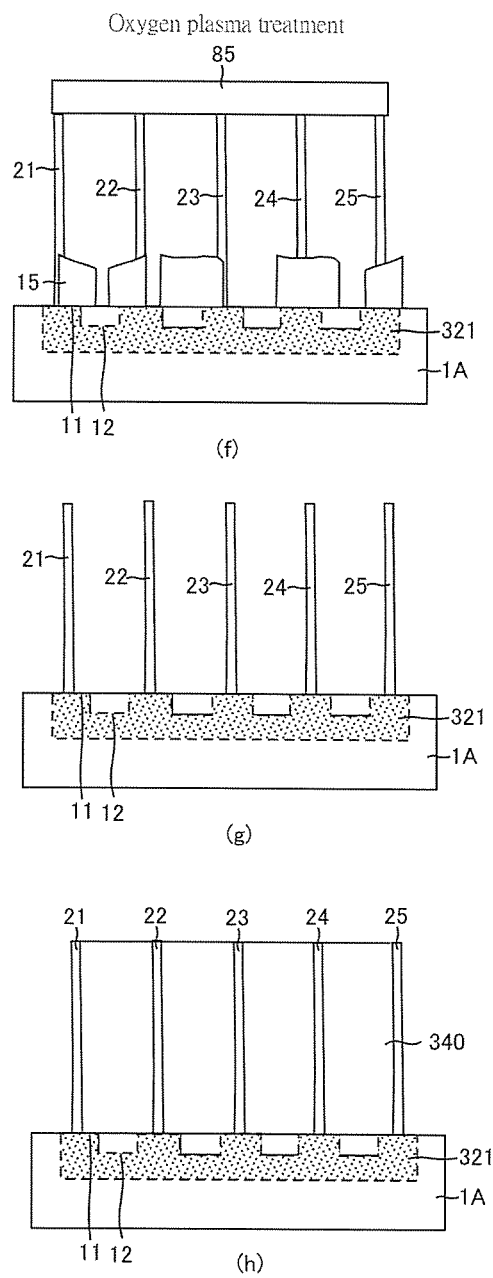
FIG. 41 is the second process chart illustrating another production method of the thin film transistor shown in FIG. 35.

After that, by sequentially performing the same processes as Steps (c) to (e) shown in FIG. 27 and Step (f) shown in FIG. 28, the carbon nanowall thin films 15 other than the carbon nanowall thin films 21 to 25 are removed by oxygen plasma, and the resist pattern 85 is removed (refer to Step (d) and (e) of FIG. 40 and Steps (f) and (g) of FIG. 41).

Figure 42:
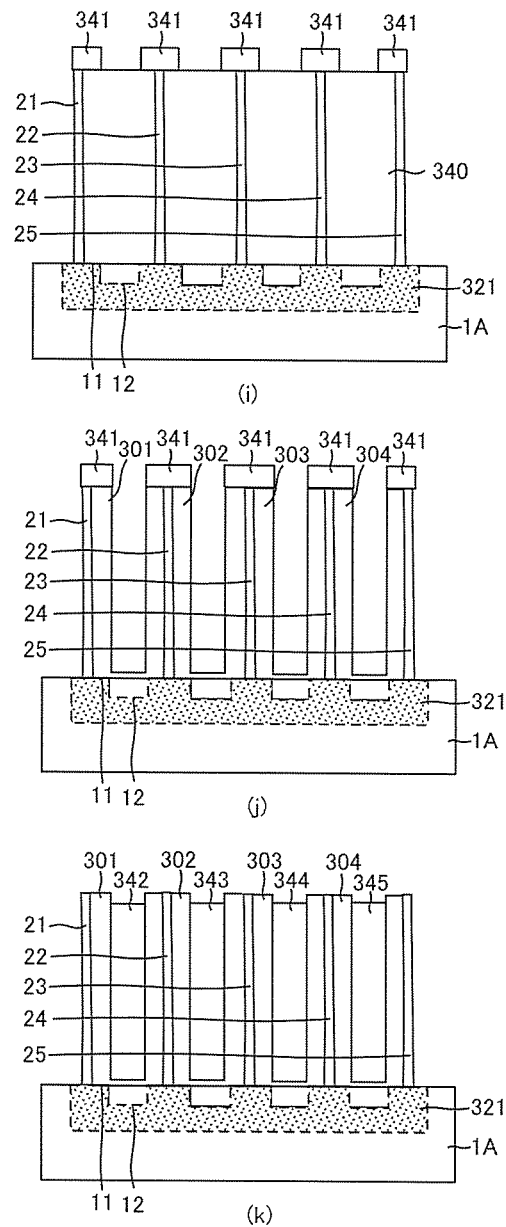
FIG. 42 is the third process chart illustrating another production method of the thin film transistor shown in FIG. 35.
Figure 43:
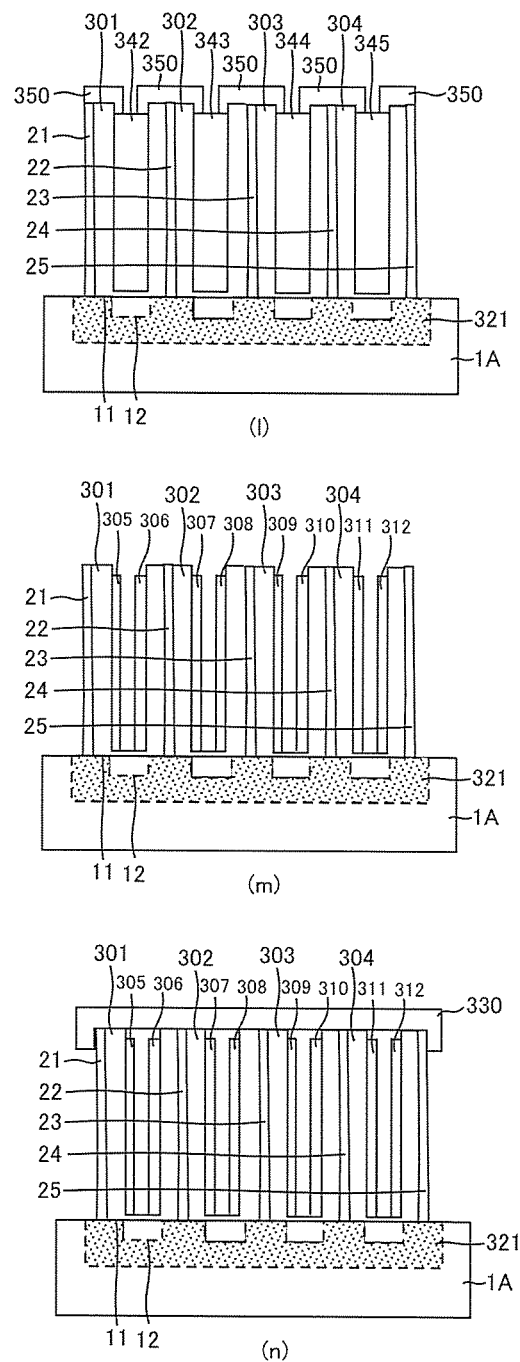
FIG. 43 is the fourth process chart illustrating another production method of the thin film transistor shown in FIG. 35.
Figure 44:
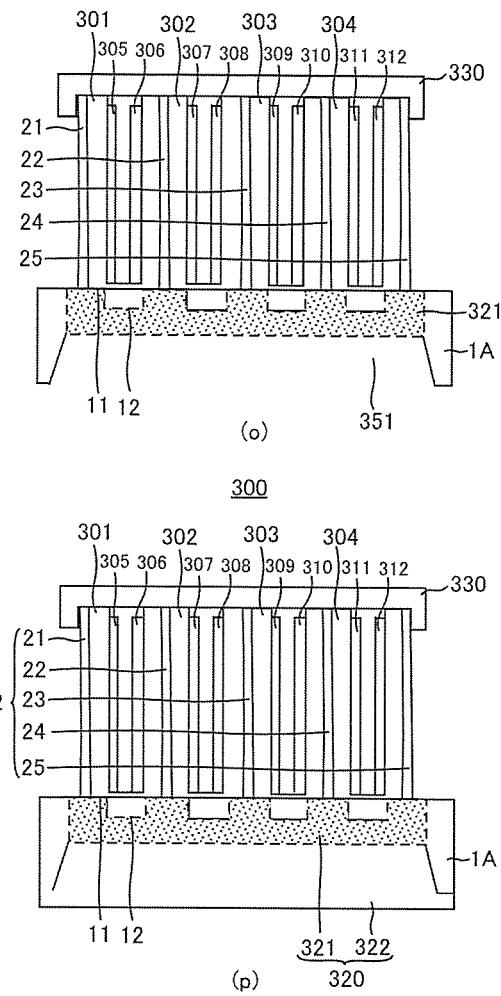
FIG. 44 is the fifth process chart illustrating another production method of the thin film transistor shown in FIG. 35.

After Step (g), the same processes as Step (e) of FIG. 36 to Step (m) of FIG. 39 are sequentially performed (refer to Step (h) of FIG. 41, Steps (i) to (k) of FIG. 42, Steps (l) to (n) of FIG. 43 and Steps (o) and (p) of FIG. 44). Thereby, the production of the thin film transistor 300 is completed.

As described above, the thin film transistor 300 in which the channel layer 2 is disposed in the normal direction of the silicon substrate 1A is also produced by removing the carbon nanowall thin films 15 formed in the region 14 by oxygen plasma. As a result, the leakage current in the thin film transistor 300 can be significantly reduced.

Though the process charts shown in FIGS. 40 to 44 are the process charts in which the thin film transistor 300 is produced by forming the gate electrodes 305 to 312, the source electrode 320 and the drain electrode 330 after removing the carbon nanowall thin films 15 formed on the region 14 by oxygen plasma, the third embodiment is not limited thereto. The thin film transistor 300 may also be produced by removing the carbon nanowall thin films 15 formed on the region 14 by oxygen plasma after forming the gate electrodes 305 to 312, the source electrode 320 and the drain electrode 330.

FIGS. 45 to 48 are respectively the first to the fourth process charts illustrating yet another production method of the thin film transistor 300 shown in FIG. 35.

The process charts shown in FIGS. 45 to 48 are the same as the process charts shown in FIGS. 36 to 39 except that Step (d-1) is added between Step (d) and Step (e) shown in FIGS. 36 to 39.

Figure 45:
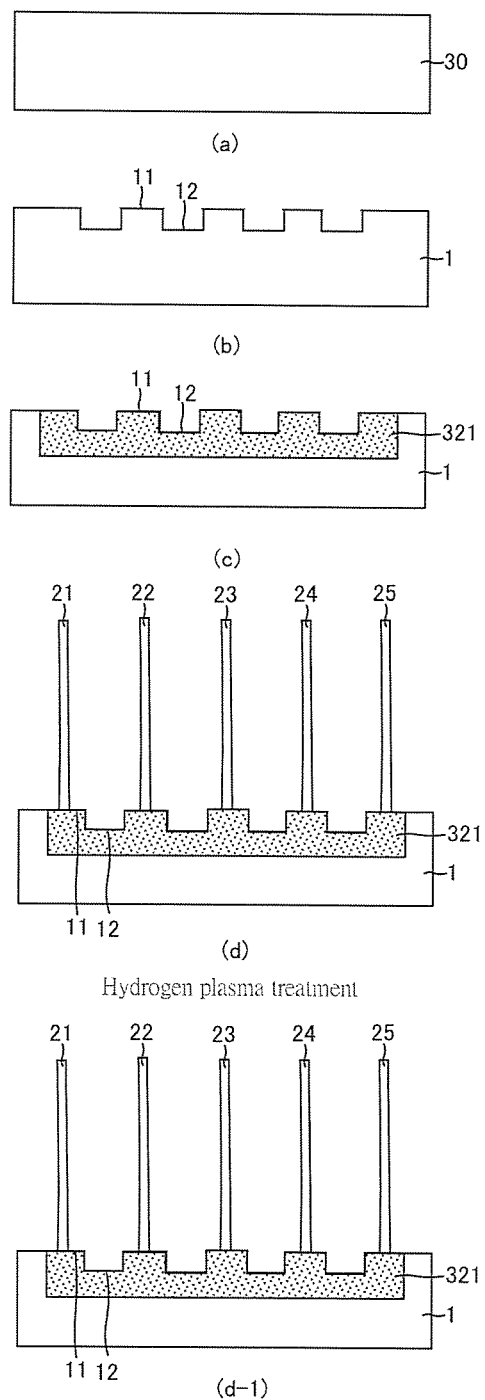
FIG. 45 is the first process chart illustrating yet another production method of the thin film transistor shown in FIG. 35.

Referring to FIG. 45, when the production of the thin film transistor 300 begins, the same processes as Steps (a) to (d) shown in FIG. 36 are sequentially performed (refer to Steps (a) to (d)).

Then, the surfaces of the carbon nanowall thin films 21 to 25 are processed by hydrogen plasma by performing the same process as Step (d-1) shown in FIG. 14 (refer to Step (d-1)).

Figure 46:
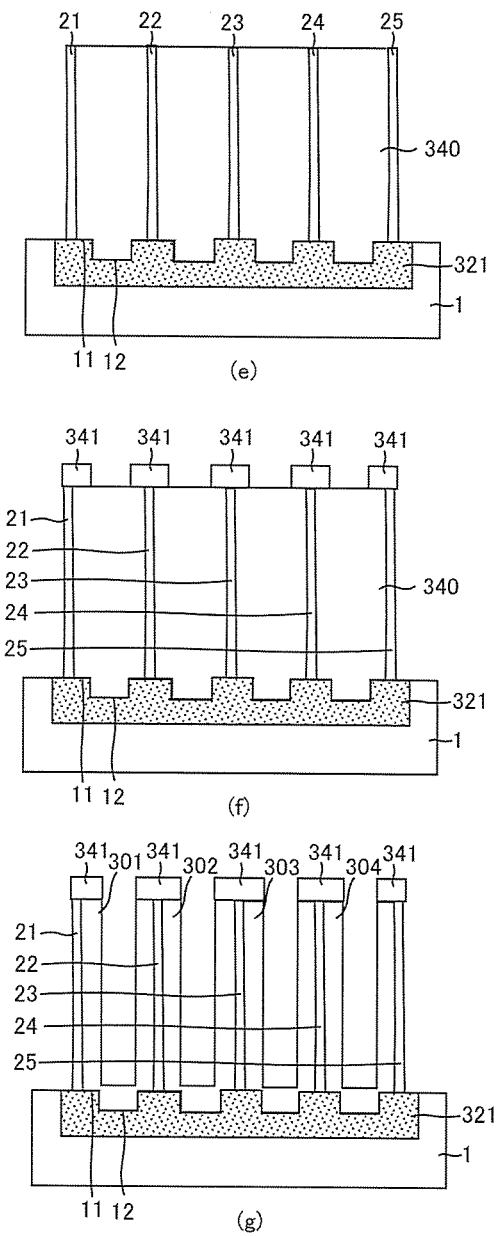
FIG. 46 is the second process chart illustrating yet another production method of the thin film transistor shown in FIG. 35.
Figure 47:
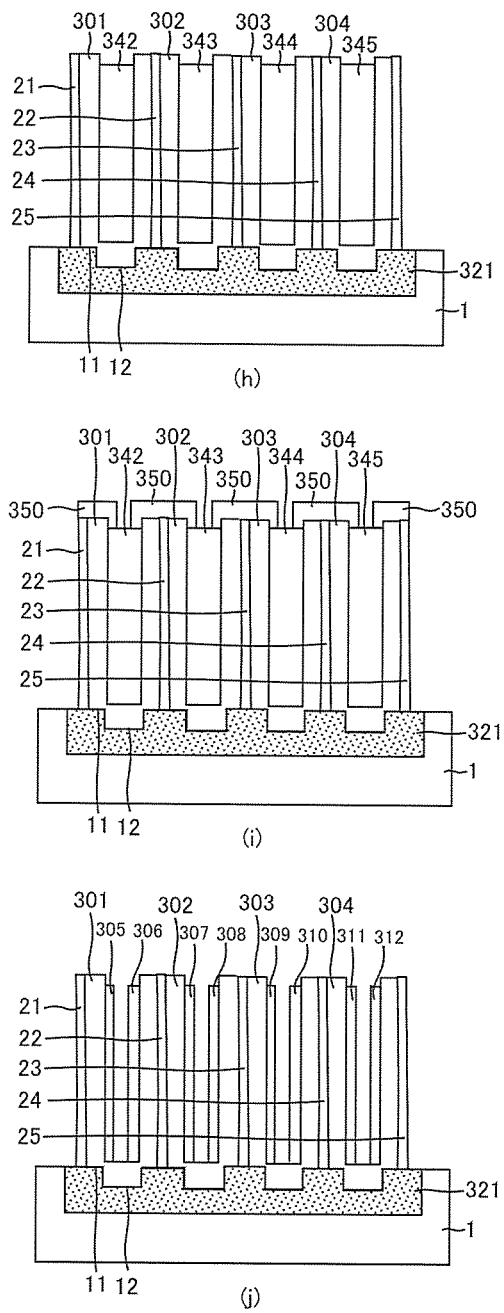
FIG. 47 is the third process chart illustrating yet another production method of the thin film transistor shown in FIG. 35.
Figure 48:
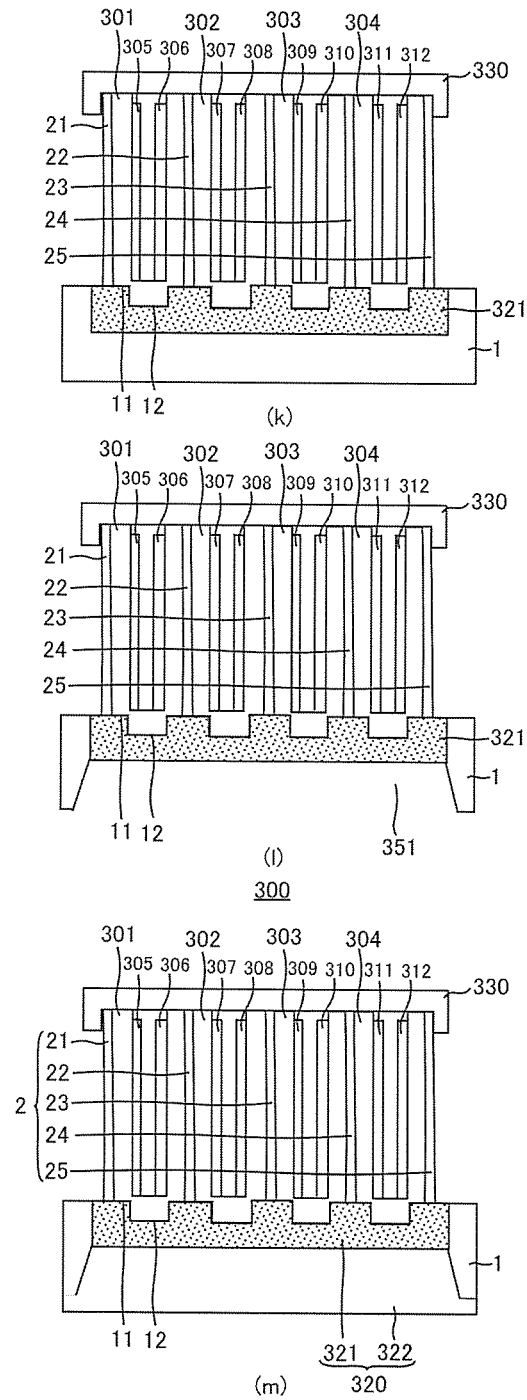
FIG. 48 is the fourth process chart illustrating yet another production method of the thin film transistor shown in FIG. 35.

After that, the same processes as Step (e) of FIG. 36 to Step (m) of FIG. 39 are sequentially performed (refer to Steps (e) to (g) of FIG. 46, Steps (h) to (j) of FIG. 47 and Steps (k) to (m) of FIG. 48). Thereby, the production of the thin film transistor 300 is completed.

As described above, the thin film transistor 300 in which the channel layer 2 is disposed in the normal direction of the silicon substrate 1A is also produced by forming the drain electrode 330 after processing the surfaces of the carbon nanowall thin films 21 to 25 by hydrogen plasma. As a result, the adhesion of the drain electrode 330 in the thin film transistor 300 can be enhanced.

Figure 49:
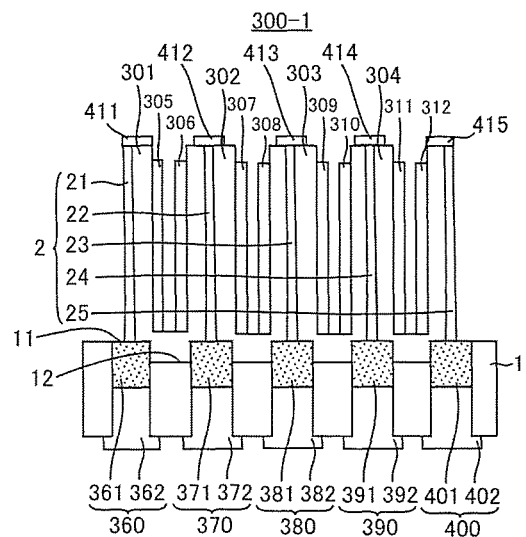
FIG. 49 is a cross-sectional view illustrating the structure of another thin film transistor of the third embodiment.
Figure 50:
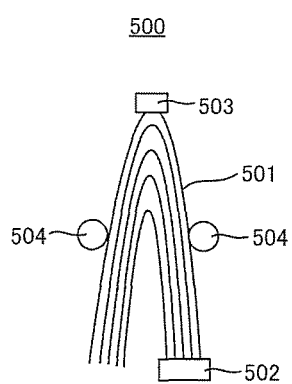
FIG. 50 is a schematic diagram illustrating a conventional vertical current driven device.

FIG. 49 is a cross-sectional view illustrating the structure of another thin film transistor of the third embodiment. The thin film transistor of the third embodiment may be a thin film transistor 300-1 shown in FIG. 49.

Referring to FIG. 49, the thin film transistor 300-1 is the same as the thin film transistor 300 except that the source electrode 320 of the thin film transistor 300 of FIG. 35 is replaced with source electrodes 360, 370, 380, 390 and 400, and the drain electrode 330 is replaced with drain electrodes 411 to 415.

The source electrodes 360, 370, 380, 390 and 400 are disposed respectively corresponding to the carbon nanowall thin films 21 to 25.

The source electrode 360 includes an impurity region 361 and a metal region 362. The source electrode 370 includes an impurity region 371 and a metal region 372. The source electrode 380 includes an impurity region 381 and a metal region 382. The source electrode 390 includes an impurity region 391 and a metal region 392. The source electrode 400 includes an impurity region 401 and a metal region 402.

Each of the impurity regions 361, 371, 381, 391 and 401 contacts the protruding portions 11 of the silicon substrate 1 and is disposed in the silicon substrate 1. Each of the impurity regions 361, 371, 381, 391 and 401 has a conduction type the same as or opposite to the conduction type of the silicon substrate 1, and has an impurity concentration of approximately $10^{20}$ cm$^{-3}$. More specifically, each of the impurity regions 361, 371, 381, 391 and 401 has a P concentration or a B concentration of approximately $10^{20}$ cm$^{-3}$ regardless of the conduction type of the silicon substrate 1.

The metal regions 362, 372, 382, 392 and 402 respectively contact the impurity regions 361, 371, 381, 391 and 401 as well as the silicon substrate 1. Each of the metal regions 362, 372, 382, 392 and 402 has a structure of successively laminated Ti and Au.

As a result of that each of the impurity regions 361, 371, 381, 391 and 401 is disposed in the silicon substrate 1 in contact with the protruding portions 11 of the silicon substrate 1, one ends of the carbon nanowall thin films 21 to 25 in the normal direction of the silicon substrate 1 respectively contact the source electrodes 360, 370, 380, 390 and 400.

Each of the drain electrodes 411 to 415 has a structure of successively laminated Ti and Au. The drain electrodes 411 to 415 are disposed to be respectively in contact with the side surfaces in parallel to the thickness direction of the carbon nanowall thin films 21 to 25 and the side surfaces in parallel to the thickness direction of the insulating films 301 to 304 on the opposite side to the silicon substrate 1 side.

In the thin film transistor 300-1, the carbon nanowall thin film 21, the source electrode 360, the drain electrode 411, the insulating film 301 and the gate electrode 305 constitute one thin film transistor; the carbon nanowall thin film 22, the source electrode 370, the drain electrode 412, the insulating films 301 and 302 and the gate electrodes 306 and 307 constitute one thin film transistor; the carbon nanowall thin film 23, the source electrode 380, the drain electrode 413, the insulating films 302 and 303 and the gate electrodes 308 and 309 constitute one thin film transistor; the carbon nanowall thin film 24, the source electrode 390, the drain electrode 414, the insulating films 303 and 304 and the gate electrodes 310 and 311 constitute one thin film transistor; and the carbon nanowall thin film 25, the source electrode 400, the drain electrode 415, the insulating film 304 and the gate electrode 312 constitute one thin film transistor.

As a result, the thin film transistor 300-1 has a structure in which five thin film transistors are disposed in parallel in the normal direction of the silicon substrate 1.

The thin film transistor 300-1 is produced by forming the impurity regions 361, 371, 381, 391 and 401 by ion implantation of impurity atoms (P or B) only to the protruding portions 11 of the silicon substrate 1 in Step (c), forming the drain electrodes 411 to 415 in Step (k), forming five holes respectively contacting the impurity regions 361, 371, 381, 391 and 401 on the back surface side of the silicon substrate 1 in Step (l), and forming the metal regions 362, 372, 382, 392 and 402 in the previously formed five holes in Step (m) according to the process charts shown in FIGS. 36 to 39.

Moreover, the thin film transistor 300-1 may be produced by forming the impurity regions 361, 371, 381, 391 and 401 by ion implantation of impurity atoms (P or B) only to the protruding portions 11 of the silicon substrate 1 in Step (c), forming the drain electrodes 411 to 415 in Step (n), forming five holes respectively contacting the impurity regions 361, 371, 381, 391 and 401 on the back surface side of the silicon substrate 1 in Step (o), and forming the metal regions 362, 372, 382, 392 and 402 in the previously formed five holes in Step (p) according to the process charts shown in FIGS. 40 to 44.

Further, the thin film transistor 300-1 may be produced by forming the impurity regions 361, 371, 381, 391 and 401 by ion implantation of impurity atoms (P or B) only to the protruding portions 11 of the silicon substrate 1 in Step (c), forming the drain electrodes 411 to 415 in Step (k), forming five holes respectively contacting the impurity regions 361, 371, 381, 391 and 401 on the back surface side of the silicon substrate 1 in Step (l), and forming the metal regions 362, 372, 382, 392 and 402 in the previously formed five holes in Step (m) according to the process charts shown in FIGS. 45 to 48.

Since the thin film transistor 300-1 has a structure in which five thin film transistors are disposed in parallel in the normal direction of the silicon substrate 1, the thin film transistor 300-1 can benefit from the same effect as the previously mentioned thin film transistor 10-1 (refer to FIG. 21).

In the thin film transistor 300, the drain electrode 330 may be disposed in the silicon substrate 1 like the source electrode 320, and the source electrode 320 may contact the carbon nanowall thin films 21 to 25 on the opposite side to the silicon substrate 1 side in the normal direction of the silicon substrate 1 like the drain electrode 330.

Accordingly, in the thin film transistor 300, one of the source electrode 320 and the drain electrode 330 may be disposed in the silicon substrate 1 so as to contact the protruding portions 11 and the recessed portions 12, and the other one of the source electrode 320 and the drain electrode 330 may contact the carbon nanowall thin films 21 to 25 on the opposite side to the silicon substrate 1 side in the normal direction of the silicon substrate 1.

Also, in the thin film transistor 300-1, one set of the source electrodes 360, 370, 380, 390 and 400 and the drain electrodes 411 to 415 may be disposed in the silicon substrate 1 so as to contact the protruding portions 11 and the recessed portions 12, and the other set of the source electrodes 360, 370, 380, 390 and 400 and the drain electrodes 411 to 415 may contact the carbon nanowall thin films 21 to 25 on the opposite side to the silicon substrate 1 side in the normal direction of the silicon substrate 1.

Other descriptions regarding the third embodiment are the same as the descriptions of the first embodiment.

As described above, back gate type thin film transistors 10 and 10-1 are described in the first embodiment, and top gate type thin film transistors 200 and 200-1 are described in the second embodiment, and then thin film transistors 300 and 300-1 in which the channel layer 2 is disposed in the normal direction of the silicon substrate 1 or 1A are described in the third embodiment.

Accordingly, the thin film transistor according to the embodiments of the present invention may include a silicon substrate on one main surface of which a concave-convex shape is formed in stripe-like or grid-like configurations, a channel layer formed of a plurality of carbon nanowall thin films which are disposed on a plurality of protruding portions of the concave-convex shape in the length direction of the protruding portion and each of which is grown in the normal direction of the silicon substrate, a source electrode at least contacting the first side surface of each of the plurality of carbon nanowall thin films which is in parallel to the thickness direction of the carbon nanowall thin film, a drain electrode disposed to face the source electrode in the in-plane direction of the carbon nanowall thin films and contacting the second side surface opposite to the first side surface of each of the plurality of carbon nanowall thin films, a gate electrode, and an insulating film disposed between the plurality of carbon nanowall thin films and the gate electrode.

The production method of the thin film transistor according to the embodiments of the present invention is the production method of the thin film transistor using a plurality of carbon nanowall thin films as a channel layer, and the production method may include the first process to form a concave-convex shape in stripe-like or grid-like configurations on one main surface of a silicon substrate, the second process to form a plurality of carbon nanowall thin films on a plurality of protruding portions of the concave-convex shape in the length direction of the protruding portion, the third process to form a source electrode so as to at least contact the first side surface of each of the plurality of carbon nanowall thin films which is in parallel to the thickness direction of the carbon nanowall thin film, the fourth process to form a drain electrode disposed so as to face the source electrode in the in-plane direction of the carbon nanowall thin films and to at least contact the second side surface opposite to the first surface of each of the plurality of carbon nanowall thin films, the fifth process to form an insulating film so as to face the plurality of carbon nanowall thin films, and the sixth process to form a gate electrode so as to contact the insulating film.

The embodiments disclosed here should be considered as examples and not as limitations. The scope of the present invention is defined by the attached claims and not by the abovementioned descriptions of the embodiments, and it is intended that meanings equal to the scope of the claims and all modifications within the scope are encompassed.

INDUSTRIAL APPLICABILITY

This invention is applied to thin film transistors and production methods thereof.

What is claimed is:

1. A thin film transistor, comprising:
a silicon substrate having a main surface formed with a stripe-like or grid-like concave-convex configuration;
a channel layer formed of a plurality of carbon nanowall thin films which are disposed on a plurality of protruding portions along a length direction of the protruding portion of the concave-convex shape, and respectively grows in a normal direction of the silicon substrate;
a source electrode at least contacting a first side surface of each of the plurality of carbon nanowall thin films which is in parallel to a thickness direction of the carbon nanowall thin film;
a drain electrode disposed so as to be opposed to the source electrode in an in-plane direction of the carbon nanowall thin film, and at least contacting a second side surface of each of the plurality of carbon nanowall thin films which is opposite to the first side surface;
a gate electrode; and
an insulating film disposed between the plurality of carbon nanowall thin films and the gate electrode.

2. The thin film transistor of claim 1, wherein:
the insulating film is disposed to be in contact with a surface opposite to the one main surface of the silicon substrate, and
the gate electrode is disposed to be in contact with the insulating film, and
the source electrode and the drain electrode are disposed along the length direction of the protruding portion of the concave-convex shape.

3. The thin film transistor of claim 1, wherein:
the insulating film is disposed to be in contact with a third side surface of each of the plurality of carbon nanowall thin films which is in parallel to the thickness direction of the carbon nanowall thin film on an opposite side of a silicon substrate side, and
the gate electrode is disposed to be in contact with the insulating film, and
the source electrode and the drain electrode are disposed along the length direction of the protruding portion of the concave-convex shape.

4. The thin film transistor of claim 2, wherein:
the source electrode is formed of a plurality of source electrode members provided corresponding to the plurality of carbon nanowall thin films, and each of the source electrode members is disposed to be at least in contact with the first side surface of the corresponding carbon nanowall thin film, and
the drain electrode is formed of a plurality of drain electrode members provided corresponding to the plurality of carbon nanowall thin films, and each of the drain electrode members is disposed to be at least in contact with the second side surface of the corresponding carbon nanowall thin film.

5. The thin film transistor of claim 1, wherein:
the insulating film is formed of a plurality of gate insulating films which are provided corresponding to the plurality of carbon nanowall thin films and are disposed along the in-plane direction of the carbon nanowall thin film, and each of the gate insulating films at least contacts the corresponding carbon nanowall thin film, and
the gate electrode is formed of a plurality of gate electrode members provided corresponding to the plurality of gate insulating films, and each of the gate electrode members is disposed to be in contact with the corresponding gate insulating film, and one of the source electrode and the drain electrode is disposed in the silicon substrate on the protruding portion side, and the other one of the source electrode and the drain electrode is disposed on an opposite side of the silicon substrate side in the normal direction of the silicon substrate.

6. The thin film transistor of claim 1, wherein:

the insulating film is formed of a plurality of gate insulating films which are provided corresponding to the plurality of carbon nanowall thin films and are disposed along the in-plane direction of the carbon nanowall thin film, and each of the gate insulating films at least contacts the corresponding carbon nanowall thin film, and the gate electrode is formed of a plurality of gate electrode members provided corresponding to the plurality of gate insulating films, and each of the gate electrode members is disposed to be in contact with the corresponding gate insulating film, and one of the source electrode and the drain electrode is formed of a plurality of first electrode members provided corresponding to the plurality of carbon nanowall thin films, and the other one of the source electrode and the drain electrode is formed of a plurality of second electrode members provided corresponding to the plurality of carbon nanowall thin films, and each of the plurality of first electrode members comprises an impurity region formed in a protruding portion which contacts the corresponding carbon nanowall thin film and a metal region disposed to be in contact with the impurity region, and each of the plurality of second electrode members is in contact with a third side surface of the corresponding carbon nanowall thin film which is in parallel to the thickness direction of the corresponding carbon nanowall thin film and disposed on an opposite side of the silicon substrate side.

7. A production method for producing a thin film transistor which uses a plurality of carbon nanowall thin films as a channel layer, the production method comprising:

a first process of forming a concave-convex shape in stripe-like or grid-like concave-convex configurations on a main surface of a silicon substrate;

a second process of forming the plurality of carbon nanowall thin films on a plurality of protruding portions of the concave-convex shape along a length direction of the protruding portion;

a third process of forming a source electrode so as to at least contact a first side surface of each of the plurality of carbon nanowall thin films which is in parallel to a thickness direction of the carbon nanowall thin film;

a fourth process of forming a drain electrode disposed so as to be opposed to the source electrode in an in-plane direction of the carbon nanowall thin film and at least contact a second side surface of each of the plurality of carbon nanowall thin films which is opposite to the first side surface;

a fifth process of forming an insulating film so as to face the plurality of carbon nanowall thin films; and a sixth process of forming a gate electrode so as to contact the insulating film.

8. The production method for producing the thin film transistor of claim 7, further comprising:

a seventh process of removing the carbon nanowall thin films formed in a region other than a disposition region of the thin film transistor by plasma using oxygen gas.

9. The production method for producing the thin film transistor of claim 7, further comprising:

an eighth process of processing the plurality of carbon nanowall thin films by plasma using hydrogen gas, wherein the third process and the fourth process are performed following the eighth process.

* * * * *